(12) United States Patent
Hasei et al.

(10) Patent No.: US 8,197,882 B2
(45) Date of Patent: Jun. 12, 2012

(54) METHOD FOR FORMING THIN FILM PATTERN, THIN FILM MANUFACTURING DEVICE, CONDUCTIVE THIN FILM WIRING, ELECTRO-OPTIC DEVICE, ELECTRONIC APPARATUS, AND NON-CONTACT CARD MEDIUM

(75) Inventors: Hironori Hasei, Suwa (JP); Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 619 days.

(21) Appl. No.: 11/636,691

(22) Filed: Dec. 8, 2006

(65) Prior Publication Data

US 2007/0082144 A1 Apr. 12, 2007

Related U.S. Application Data

(62) Division of application No. 10/674,292, filed on Sep. 29, 2003, now abandoned.

(30) Foreign Application Priority Data

Sep. 30, 2002 (JP) ................................. 2002-287453
Aug. 27, 2003 (JP) ................................. 2003-303512

(51) Int. Cl.
*B05D 1/32* (2006.01)
(52) U.S. Cl. .......................................... 427/58; 427/256
(58) Field of Classification Search .................. 428/901; 427/58, 256, 299, 466
See application file for complete search history.

(56) References Cited

U.S. PATENT DOCUMENTS

| 5,132,248 | A | 7/1992 | Drummond et al. |
| 6,053,596 | A * | 4/2000 | Nakano et al. ................. 347/15 |
| 6,267,476 | B1 * | 7/2001 | Kato et al. ..................... 347/100 |
| 6,387,813 | B1 | 5/2002 | Yang et al. |
| 6,599,582 | B2 | 7/2003 | Kiguchi et al. |
| 6,613,399 | B2 | 9/2003 | Miyamoto et al. |
| 6,829,135 | B2 | 12/2004 | Honda et al. |
| 7,198,816 | B2 | 4/2007 | Masuda et al. |
| 2002/0015800 | A1 * | 2/2002 | Miyamoto et al. ............ 427/553 |
| 2002/0060518 | A1 | 5/2002 | Duineveld et al. |
| 2003/0003231 | A1 * | 1/2003 | Kiguchi et al. ................ 427/282 |
| 2003/0008217 | A1 | 1/2003 | Kobayashi |

(Continued)

FOREIGN PATENT DOCUMENTS

CN 1366686 A 8/2002

(Continued)

OTHER PUBLICATIONS

Communication from Japan re: counterpart application No. 2003-303512.

(Continued)

*Primary Examiner* — Michael Cleveland
*Assistant Examiner* — Tabassom Tadayyon Eslami
(74) *Attorney, Agent, or Firm* — Harness, Dickey & Pierce, P.L.C.

(57) ABSTRACT

A contact angle for a liquid on a substrate is set by a surface treatment process such that defects do not occur in a thin film pattern. In particular, the contact angle is set in a range of 15° to 45°. By doing this, it is possible to provide a device, a conductive thin film wiring device, and a method for forming a thin film pattern in which defects such as disconnections and short circuits can be prevented in a thin film pattern which is formed by an ink jet method.

1 Claim, 18 Drawing Sheets

U.S. PATENT DOCUMENTS

| | | |
|---|---|---|
| 2003/0059686 A1 | 3/2003 | Kobayashi et al. |
| 2003/0083203 A1* | 5/2003 | Hashimoto et al. ........... 505/100 |
| 2003/0137242 A1 | 7/2003 | Seki |
| 2003/0232128 A1 | 12/2003 | Furusawa et al. |

FOREIGN PATENT DOCUMENTS

| | | |
|---|---|---|
| JP | 08-072235 | 3/1996 |
| JP | 10-326559 | 8/1998 |
| JP | 11-204529 | 7/1999 |
| JP | 11-339642 | 12/1999 |
| JP | 2002-169190 | 6/2002 |
| JP | 2002-196127 | 7/2002 |
| JP | 2002-214425 | 7/2002 |
| KR | 1998-080529 | 11/1998 |
| KR | 1999-0067996 | 8/1999 |
| WO | WO 01/46987 | 6/2001 |
| WO | WO 02/073712 | 9/2002 |

OTHER PUBLICATIONS

Communication from Japanese Patent Office re: counterpart application.

Communication from Taiwan Patent Office re: counterpart application.

Communication from Japan re: counterpart application No. 2003-303512, Jun. 29, 2004.

Communication from Japanese Patent Office re: counterpart application, Sep. 28, 2004.

Communication from Korean Patent Office regarding related application.

Communication from Taiwan Patent Office re: counterpart application, available Sep. 28, 2005.

* cited by examiner

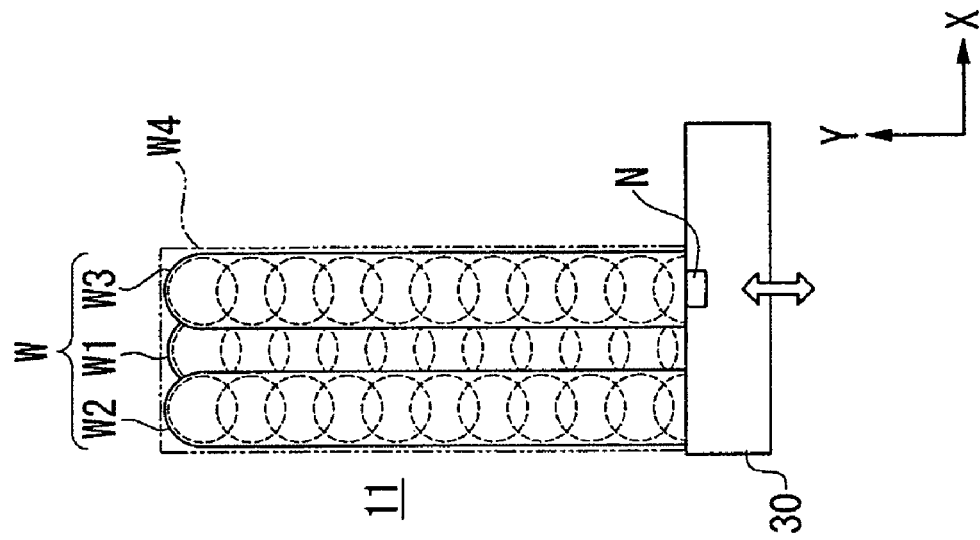
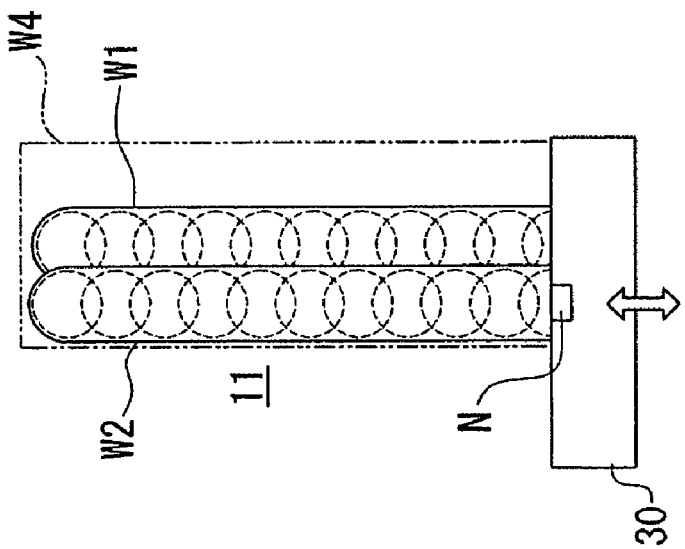
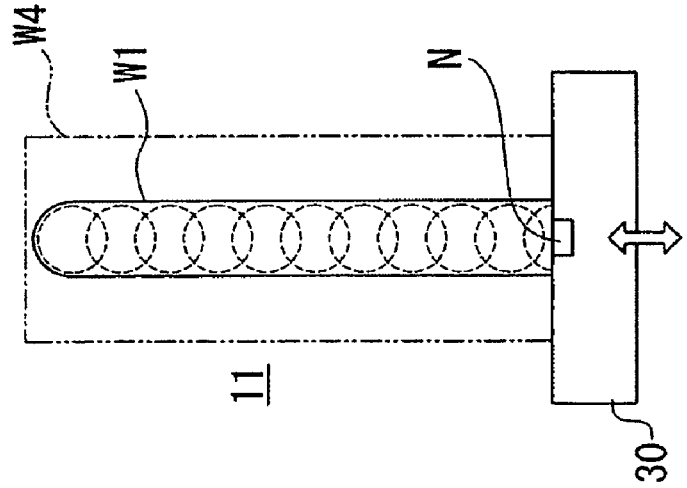

(a)

(b)

METHOD FOR FORMING THIN FILM PATTERN, THIN FILM MANUFACTURING DEVICE, CONDUCTIVE THIN FILM WIRING, ELECTRO-OPTIC DEVICE, ELECTRONIC APPARATUS, AND NON-CONTACT CARD MEDIUM

CROSS-REFERENCE TO RELATED APPLICATIONS

This application is a divisional of U.S. patent application Ser. No. 10/674,292 filed on Sep. 29, 2003 now abandoned. This application claims the benefit of Japanese Patent Application No. 2002-287453 filed Sep. 30, 2002 and Japanese Patent Application No. 2003-303512 filed Aug. 27, 2003. The disclosures of the above applications are incorporated herein by reference.

BACKGROUND OF THE INVENTION

1. Field of the Invention

The present invention relates to a method for forming a thin film pattern, a device for manufacturing a thin film pattern, a conductive thin film wiring, an electro-optic device, an electronic apparatus, and a non-contact card medium.

2. Description of Related Art

For manufacturing a wiring which is used for an electronic circuit or an integrated circuit, for example, a lithography method is used. In the lithography method, large equipment such as a vacuum device and complicated processes, are necessary. Also, only a few percent of the raw materials is actually used, and most of the raw material is discarded; therefore, manufacturing cost is high. As an alternative processing method for the lithography method, there is proposed a method in which a liquid which contains a functional material is directly patterned on a substrate by an ink jet method. For example, a liquid in which a conductive particle is dispersed is directly patterned on a substrate by an ink jet method, and the pattern is converted into a conductive thin film pattern by a thermal treatment process or laser ejection (see, e.g., U.S. Pat. No. 5,132,248).

However, in the above conventional technique, there were problems as described below. That is, in the patterning operation in the ink jet method, it was not possible to control shape, dimension, and position of the liquid drop (liquid) on the substrate unless an appropriate treatment was performed on a surface of the substrate; thus, it was difficult to manufacture a conductive thin film pattern having a desired shape. In the above patent document, details of method for controlling the ejected pattern shape are not disclosed.

SUMMARY OF THE INVENTION

The present invention was made in consideration of the above problems. Objects of the present invention are to provide a method for forming a thin film pattern and a thin film forming device in which defects such as disconnection and short circuits on the thin film pattern which is formed by the ink jet method can be prevented.

Also, other objects of the present invention are to provide a conductive thin film wiring in which defects such as disconnections and short circuits hardly occur. Furthermore, other object of the present invention is to provide an electro-optic device, an electronic apparatus, and a non-contact card medium in which defects such as disconnections and short circuits in a wiring section hardly occur.

In order to solve the above problems, a method for forming a thin film pattern by ejecting a liquid drop which is made from a liquid which contains a conductive particles onto a predetermined thin film forming area on a substrate according to the present invention comprises a step for performing a surface treatment on the substrate before ejecting the liquid drop in which a contact angle of the liquid drop on the substrate is set.

Here, the thin film forming area indicates an area in which a thin film pattern is supposed to be formed. The thin film forming area is formed by a single line or curve, or by a plurality of lines or curves. Also, the "defect" particularly refers to a defect such as a disconnection which occurs in a formed thin film pattern.

According to the above method, a contact angle is set such that a defect does not occur in a thin film pattern which is formed in the surface treatment process particularly such as a metal wiring (conductive thin film wiring) which is formed by conductive particles. Therefore, it is possible to form a metal wiring which can be formed in a fine form in which defects such as disconnections and short circuits hardly occurs.

Here, the contact angle depends on the relationship between the substrate and the liquid; therefore, the contact angle also depends on a property of the liquid. However, there are limits to a properties in the liquid which is ejected by the ink jet method, such as surface tension and viscosity. Therefore, it is actually difficult to adjust the contact angle by adjusting only the properties of the liquid. Thus, it is appropriate to set the contact angle by performing a surface treatment on the substrate.

In a method for forming a thin film pattern according to the present invention, the contact angle is set according to the diameter of the ejected liquid drop on the substrate.

According to the above method, the contact angle is selected according to the diameter of the liquid drop preferably; thus, it is possible to form a superior desirable thin film pattern.

Furthermore, in a method for forming a thin film pattern according to the present invention, the contact angle is in a range of 15° to 45°.

By doing this, it is possible to form a superior desirable thin film pattern without a defect in a formed thin film pattern.

In particular, if the contact angle is too small, such as 14°, the liquid drops (dots) spread excessively; therefore, it is difficult to control a diameter of the ejected liquid drop and form the desirable pattern.

On the other hand, if the contact angle is too large, such as 46°, an adhering force of the liquid drop to the substrate is weak, although it is possible to form the pattern. Thus, there is a problem in that the ejected liquid drops are removed from the substrate due to a difference of a thermal coefficient from that of the substrate 11 when sintered. Therefore, it is possible to control the spread of the liquid drops (dots) desirably by setting the contact angle in a range of 15° to 45°. Furthermore, there is an effect in that it is possible to realize a close contact between the substrate and the formed pattern.

A method for forming a thin film pattern according to the present invention further comprises a step for converting the liquid which is ejected on the substrate to a conductive thin film by a thermal treatment or an optical treatment.

By doing this, it is possible to realize a conductivity in a conductive particle; thus, it is possible to form a conductive wiring. The thermal treatment or an optical treatment may be performed each time after ejecting the liquid drop. The thermal treatment or an optical treatment may be performed in a time after all ejection process is completed.

A thin film pattern manufacturing device according to the present invention ejects a liquid drop which is made from a liquid which contains a conductive particle to a predetermined thin film forming area on a substrate, and the thin film pattern is formed according to a method for forming a thin film pattern according to any one of the above aspects.

According to the above device, it is possible to satisfy requirements for restricting defects which occur on a formed thin film pattern by a simple process and to manufacture a thin film pattern forming device which can restrict defects such as a short circuit which occurs on the formed conductive thin film.

A conductive thin film wiring of the present invention is formed according to any one of the above methods.

According to the present invention, it is possible to form a conductive thin film wiring which can be formed in fine form such that defects such as disconnections and short circuits hardly occur.

An electro-optic device according to the present invention is provided with the above conductive thin film wiring. As an electro-optic device of the present invention, it is possible to mention, for example, a liquid crystal display device, an organic electro-luminescence display device, and a plasma display device.

Also, an electronic apparatus according to the present invention is provided with the electro-optic device according to the present invention.

Also, a non-contact card medium according to the present invention is provided with the conductive thin film wiring according to the present invention for an antenna circuit.

By these inventions, it is possible to provide an electro-optic device, and an electronic apparatus and a non-contact card medium using the same in which there are few defects or defects such as disconnections and short circuits in a wiring section and an antenna.

It is characterized in that a thin film transistor according to the present invention is formed according to the above method for forming a thin film.

According to the present invention, it is possible to manufacture a thin film transistor with a fine formability such that defects such as disconnections and short circuits hardly occurs.

Also, it is characterized in that an electro-optic device according to the present invention is provided with a thin film transistor according to the above thin film transistor.

According to these inventions, it is possible to provide an electro-optic device in which defects such as disconnections and short circuits hardly occurs. By doing this, it is possible to provide an electro-optic device having fewer defects.

BRIEF DESCRIPTION OF THE DRAWINGS

FIGS. 4A to 4C are views for showing an embodiment for a method for forming a pattern.

DETAILED DESCRIPTION OF THE INVENTION

Figure 1:
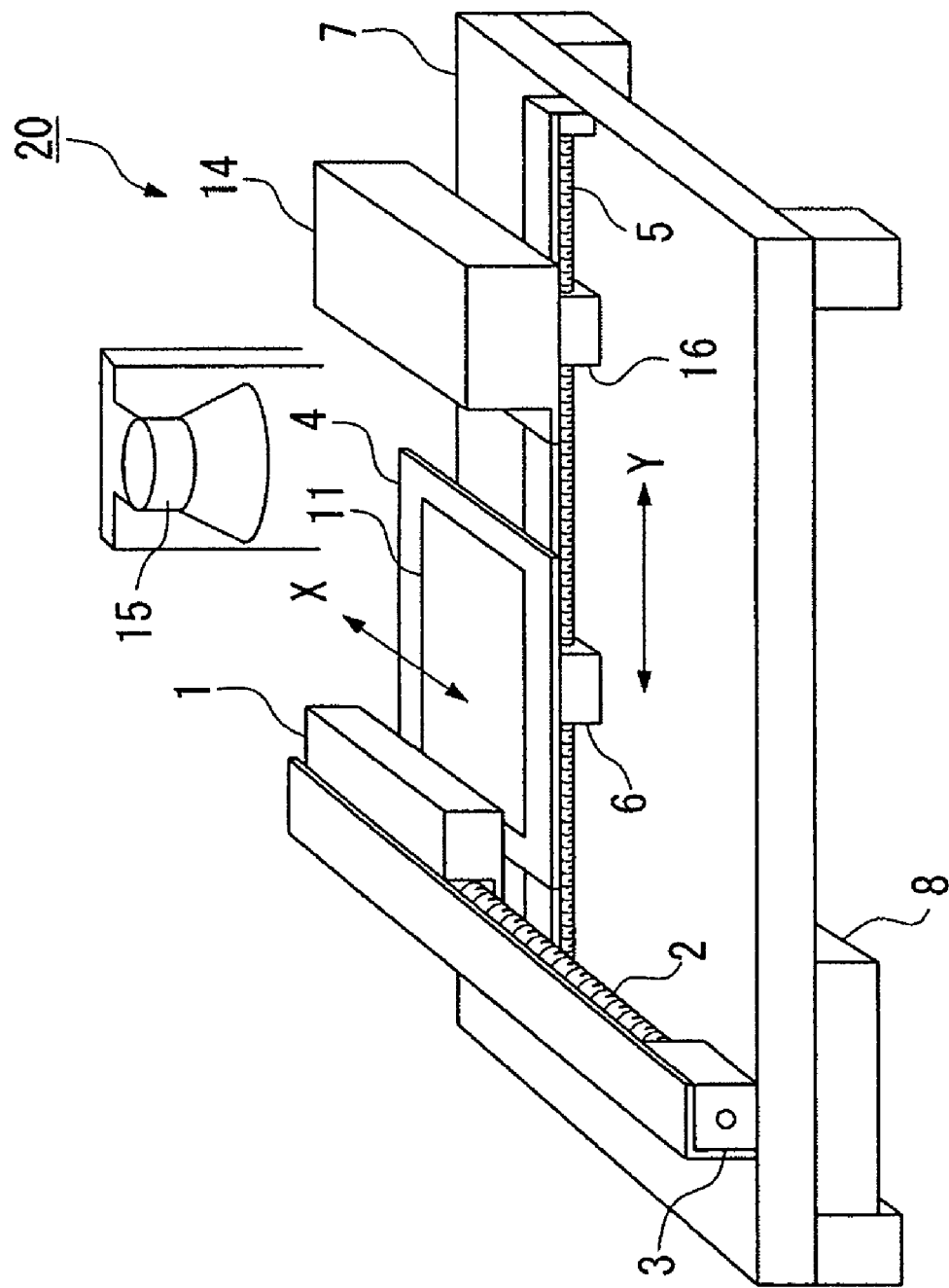
FIG. 1 is a perspective view for a wiring forming device.

Hereinafter, embodiments of the present invention are explained.
First Embodiment
For a first embodiment, a method for forming a wiring is explained for an example for forming a thin film pattern according to the present invention. The method for forming a wiring according to the present embodiment comprises a surface treatment process, an ejecting process, and a thermal treatment/optical treatment process.

Hereinafter, each process is explained.
(Surface treatment process)
For a substrate 11 on which is formed a conductive thin film wiring, various materials such as a Si wafer, a silica glass, a glass, a plastic film, and a metal plate can be used. A base layer such as a semiconductor layer, a metal layer, a dielectric layer, and an organic layer is formed on a surface of the above material substrate so as to be a substrate on which a conductive thin film wiring is supposed to be formed.

A volatility (wettability) of a surface of the substrate on which the conductive thin film wiring is supposed to be formed should preferably be controlled so as to correspond to a liquid which contains the conductive particles. More specifically, a contact angle of the liquid to a surface of the substrate should preferably be in a range of 15° to 45°. Furthermore, in order to determine a setting value for a contact angle in the above range, first, the type of substrate on which a conductive thin film wiring is supposed to be formed and the type of liquid drop which is employed are determined. A relationship between the contact angle and a diameter of the ejected liquid drop on the substrate are determined based on the above condition. Thus, the contact angle is determined according to the diameter of the liquid drop.

Hereinafter, a method for a surface treatment for obtaining a desirable contact angle is explained.

In the present embodiment, a volatizing treatment is performed on a surface of the substrate such that a desirable predetermined contact angle to a liquid which contains a conductive particle can be realized. Furthermore, a surface treatment such as a lyophilic treatment is performed.

First, a method for performing a volatizing treatment on a surface of the substrate is explained.

For a method for a volatizing treatment, a method in which a self-organizing thin film which is formed by an organizing molecule is formed on a surface of the substrate can be mentioned. An organic molecule thin film for processing a surface of the substrate has a functional group on an end of the organic molecule thin film. The organic molecule thin film has a functional group which changes (controls a surface energy) a surface characteristics of the substrate so as to be volatile on another end of the organic molecule thin film. Simultaneously, the organic molecule thin film is provided with a straight chain of a carbon which connects these functional groups or a carbon chain which is branched partly such that the organic molecule thin film is connected to the substrate so as to self-organize to be a molecule thin film such as a single molecule thin film.

The self-organizing thin film is formed by orientating a chemical compound which is formed by a connective functional group which can react with a base layer forming atom such as a substrate and the rest of a straight chain which tends to orient greatly by a mutual reaction of the straight chain. The self-organizing thin film is formed by orientating a single molecule; therefore, it is possible to form the self-organizing thin film by a quite small thickness. In addition, the self-organizing thin film has a uniform thickness from a molecular point of view. That is, the same molecules are positioned on a surface of the thin film, and it is possible to obtain a uniform and superior volatility on a surface of the thin film.

For a chemical compound which has the above high orientating tendency, for example, when a fluoroalkylsilane is used, each chemical compound is orientated such that a fluoroalkyl group is disposed on a surface of the thin film; thus, a self-organizing thin film is formed. Therefore, a uniform volatility is obtained on a surface of the thin film.

For such a chemical compound which forms a self-organizing thin film, for example, fluoroalkylsilane (hereinafter called "FAS") such as heptadecafluoro-1,1,2,2tetrahydrodecyltriethoxysinane, heptadecafluoro-1, 1, 2, 2 tetrahyrodecyl trimethoxysilane, heptadecafluoro-1,1,2,2tetrahydrodecyltrichlorosilane, tridecafluoro-1,1,2,2tetrahydrooctyltriethoxysilane, tridecafluoro-1,1,2,2tetrahdrooctyltrichlorosilane, trifluoropropyltrimethoxysilane can be mentioned. Although it is preferable to use a single chemical compound, it is acceptable to use a combined use of a plurality of chemical components instead of using a single chemical compound, as long as the purpose of the present invention is maintained. Also, it is preferable to use the above FAS for a chemical compound for forming the above self-organizing thin film so as to realize a contact to the substrate and a superior volatility in the present invention.

A structural formula for the FAS is indicated by $R_nSiX_{(4-n)}$. Here, n indicates an integer which is not greater than 3. X indicates a hydrolytic group such as a methoxy group, an ethoxy group, or halogen atom group. Also, R indicates a fluoroalkyl group and has a structure such as $(CF_3)(CF_2)_x(CH_2)y$ (here, x indicates an integer which is in a range of 0 to 10 and y indicates an integer in a range of 0 to 4) such that R and X may be the same as each other if a plurality of Rs and Xs are connected to Si. Alternatively, R and X may be different from each other. A hydrolytic group which is indicated by the X forms a silanol by hydrolysis and reacts to a hydroxyl group for a base layer such as a substrate (glass, silicon) so as to be connected with the substrate by a siloxane bonding. On the other hand, the R has a fluoro group such as $(CF_3)$ on the surface of the R; thus, the surface of the base layer such as a substrate is changed to be an unwettable surface (having a low surface energy).

A self-organizing thin film which is made of an organic molecule thin film and the like is formed on a substrate by containing the above material chemical compounds and a substrate in a closed container and allowing the container to stand for several days at a room temperature. Also, a self-organizing thin film which is made of an organic molecule thin film and the like is formed on a substrate by maintaining an overall temperature of 100 C.° for approximately three hours. The above method relates to a method for forming a self-organizing thin film in an atmospheric phase. In contrast, it is possible to form a self-organizing thin film in a liquid phase. For example, it is possible to form a self-organizing thin film on a substrate by dipping a substrate in a solvent which contains a material chemical compound and cleaning and drying the substrate.

Here, it is preferable to perform a preparatory treatment such as emitting an ultraviolet light on a surface of the substrate and cleaning the substrate by a solvent before forming a self-organizing thin film.

For other methods for a volatizing treatment, it is possible to mention a method in which a plasma is ejected at a regular pressure or under a vacuum atmosphere. It is possible to select a gas for a plasma treatment among various gases by taking a surface material for the substrate into account. For example, a gas containing a fluorocarbon can be used for a plasma treatment such as tetrafluoromethane, or perfluorohexane, perfluorodecane. In such a case, it is possible to form a volatile polymer fluoride thin film on a surface of the substrate.

It is possible to perform a volatizing treatment by applying a film having a desirable volatility such as a polyimide film having a characteristic of 4fluorideethylene on a surface of the substrate. Here, it is acceptable for a polyimide film to be used for a substrate.

Next, a method for performing a volatizing treatment is explained.

A volatility on a surface of the substrate after the above volatizing treatment is higher than a desirable volatility; therefore, the volatility is reduced by a lyophylic treatment.

For a method for lyophylic treatment, a method in which an ultraviolet light of 170 to 400 nm is emitted thereon can be mentioned. By doing this, it is possible to reduce a volatility on a formed volatile thin film while destroying an overall thin film uniformly.

In this case, it is possible to adjust the extent of reduction for the volatility by adjusting the time for emitting the ultraviolet light. The extent of reduction for the volatility can also be adjusted by the intensity of the ultraviolet light, wavelength, and a thermal (heating) treatment.

For other methods for lyophylic treatment, it is possible to mention a plasma treatment in which an oxygen is used for a reaction gas. By doing this, it is possible to reduce a volatility on a formed volatile thin film while destroying an overall thin film uniformly.

For additional methods for lyophylic treatment, it is possible to mention to a method in which a substrate is exposed to ozone atmosphere. By doing this, it is possible to reduce a volatility on a formed volatile thin film while destroying an overall thin film uniformly. In this case, it is possible to adjust an extent of reduction for the volatility by adjusting an intensity of ejection of the ultraviolet light, wavelength, and an emitting time.

(Ejecting Process)

In an ejection process for forming a wiring, a liquid member which contains a conductive particles (pattern forming component) is ejected. A liquid in which conductive particles are dispersed is used as a liquid member which contains conductive particled. For the conductive particles which are used in this case, it is possible to mention to a metal particle which contains any of gold, silver, copper, palladium, nickel, or a super-conductive particle such as a conductive polymer.

In order to improve a dispersion, it is possible to use conductive particles by coating a surface of the conductive particles by organics. For a member which is used for coating a surface of the conductive particles, it is possible to mention, for example, an organic solvent such as xylene, or toluene, and citric acid.

Also, it is preferable that the diameter of the conductive particle be in a range of 5 nm to 0.1 μm. If the diameter of the conductive particle is greater than 0.1 μm, nozzles may often be clogged; thus, an ejection according to the ink jet method would be difficult. Also, if the diameter of the conductive particle is less than 5 nm, the volume ratio of a conating member to the conductive particle is too large; thus, a ratio of the obtained organic in the thin film is too large.

It is preferable that a vapor pressure of a dispersion medium which contains a conductive particles in at a room temperature be in a range of 0.001 mmHg to 200 mmHg (approximately in a range of 0.133 Pa to 26,600 Pa). If the vapor pressure is greater than 200 mmHg, the dispersion medium vaporizes rapidly after the ejection; thus, it is difficult to form a superior thin film.

Also, the vapor pressure of the dispersion medium is preferably in a range of 0.001 mmHg to 50 mmHg (approximately in a range of 0.133 Pa to 6,650 Pa). If the vapor pressure is greater than 50 mmHg, a nozzle may be clogged often when liquid drops are ejected according to ink jet method; thus, it is difficult to perform a stable ejection. On the other hand, in a case of a dispersion medium in which the vapor pressure is lower than 0.001 mmHg, it takes time for drying operation; thus, a dispersion medium may remain in the thin film. Therefore, it is difficult to realize a superior conductive thin film after a thermal treatment and/or an optical treatment later.

There is no particular limitation for the dispersion medium as long as the dispersion medium can disperse the conductive particles and does not cause clumping. More specifically, water; alcohols such as methanol, ethanol, propanol, and butanol; hydrocarbons such as n-heptane, n-octane, decane, toluene, xylene, cymene, durene, indene, dipentene, tetrahydronaphthalene, decahydronaphthalene, and cyclohexylbenzene; ethers such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-ethoxyethyl) ether, p-dioxane; and polar compounds such as propylene carbonate, γ-butyrolactone, N-methyl-2-pyrrolidone, dimethylformamide, dimethylsulfoxide, and cyclohexanone hydrocarbons, ethers can be named. Among these dispersion media of water, alcohols, hydrocarbons, ethers are preferable in that the particles disperse easily, the dispersion liquid is stable, and these dispersion media can be used easily in the liquid drop ejecting method. As further preferable dispersion media, it is possible to name water and hydrocarbons. These dispersion media can be used independently or in combination with other dispersion media as a mixture.

A decomposition mass density in a case in which the above conductive particle is dispersed in a dispersion medium is in a range of 1 (one) mass % to 80 (eighty) mass %; thus, it is possible to adjust the decomposition mass density according to a thickness of the conductive thin film desirably.

It is preferable that a surface tension of the dispersion liquid for the above conductive particle be in a range of 0.02 N/m to 0.07 N/m. If the surface tension is not greater than 0.02 N/m when a liquid is ejected according to the ink jet method, a wettability of the ink formation to the nozzle surface increases; thus, there occurs a flying curve easily. Therefore, a meniscus shape on a tip of the nozzle is not stable when a surface tension of the dispersion liquid is greater than 0.07 N/m; thus, it is difficult to control an ejecting amount and ejecting timing.

It is possible to dope a small amount of surface tension adjusting agent such as an agent containing a fluoride, a silicon, or a nonion in the above dispersion liquid for adjusting surface tension unless a contact angle to the substrate decreases undesirably. A surface tension adjusting agent containing a nonion improves a wettablity of the liquid to the substrate and a leveling characteristics of the thin film, and prevents a roughening from occurring on a thin film. The above dispersion liquid may contain an organic compounds such as alcohol, ether, ester, and ketone according to necessity.

It is preferable that the viscosity of the above dispersion liquid be in a range of 1 mPa·s and 50 mPa·s. If the viscosity is less than 1 mPa·s when the dispersion liquid is ejected according to the ink jet method, a periphery of the nozzle may be contaminated by an overflowing ink. Also, if the viscosity is greater than 50 mPa·s, the nozzle hole is frequently clogged; thus, it is difficult to eject the liquid drop smoothly.

In the present embodiment, a liquid drop of the above dispersion liquid is ejected from an ink jet head so as to drop on a position in which a wiring is supposed to be formed on the substrate. In this case, it is necessary to control an overlap of the liquid drops which are ejected continuously such that a liquid bulge is not formed. Also, it is possible that a plurality of liquid drops are ejected distantly so as not to contact each other in a first ejection, and liquid drops are ejected to the spaces therebetween in a second ejection or later.

After the liquid drop is ejected, a drying operation is performed so as to remove a dispersion medium according to necessity. The drying operation can be performed, for example, by using an ordinary hot plate or an electric furnace for heating a substrate 11, or by a lamp annealing method. An light source for the lamp annealing method is not limited to a particular light source. For example, an infrared ray lamp, a xenon lamp, a YAG laser, an argon laser, a carbonic acid gas laser, and an excimer laser such as XeF, XeCl, XeBr, KrF, ArF, ArCl can be used for the light source. These light sources are used when its output is in a range of 10 W to 5000 W. In the present embodiment, it is sufficient if a light source has an output in a range of 100 W to 1000 W.

(Thermal Treatment/Optical Treatment)

It is necessary to remove the dispersion medium in the dried thin film completely after the ejection process so as to improve an electric contact between the particles. Also, it is necessary to remove a coating agent if a coating agent such as organic compounds are coated on a surface of the conductive particle so as to improve the dispersion. Therefore, a thermal treatment and/or an optical treatment are performed on the substrate after the ejection process.

Although the thermal treatment and/or the optical treatment are usually performed in an atmosphere, it is possible to perform the thermal treatment and/or the optical treatment in an inert gas atmosphere such as a nitrogen, argon, or helium atmosphere according to necessity. A temperature for the thermal treatment and/or the optical treatment is determined preferably according to factors such as a boiling point (vapor pressure) of the dispersion medium, type and pressure of the atmospheric gas, a thermal behavior of the particle such as a dispersion and an oxidization, whether or not there is a coating agent, and a heat-resistant temperature of the base member. For example, it is necessary to sinter the base member in approximately 300° C. of temperature so as to remove a coating agent which is formed by an organic. Also, it is necessary to sinter the base member in a range of a room temperature and 100° C. of temperature when a plastic substrate is used.

The thermal treatment and/or the optic treatment can be performed, for example, by using an ordinary hot plate or an electric furnace for heating a substrate 11, or by a lamp annealing method. An light source for the lamp annealing method is not limited to a particular light source. For example, an infrared ray lamp, a xenon lamp, a YAG laser, an argon laser, a carbonic acid gas laser, and an excimer laser such as XeF, XeCl, XeBr, KrF, ArF, ArCl can be used for the light source. These light sources are used when its output is in a range of 10 W to 5000 W. In the present embodiment, it is sufficient if a light source has an output in a range of 100 W to 1000 W. By performing the above processes, an electric contact is realized between the particles on the dried thin film after the ejection process; thus, the thin film is converted to a conductive thin film.

By doing this, there is not defect such as a disconnection in the conductive thin film which is formed in the present embodiment; thus, it is possible to form a superior desirable conductive thin film wiring.

Second Embodiment

For a second embodiment, a device for forming a thin film in which the method for forming the wiring according to the above first embodiment is performed is explained for an example for a device for thin film manufacturing device of the present invention.

FIG. 1 is a perspective view for showing a general structure for a wiring forming device according to the present embodiment. As shown in FIG. 1, a wiring forming device 20 comprises an ink jet head group 1, an X-direction guide axis 2 which drives the ink jet head group 1 in the X-direction, and an X-direction driving motor 3 which rotates the X-direction guide axis 2. The wiring forming device 20 further comprises a mounting base 4 for mounting a substrate 11 thereon, a Y-direction guide axis 5 which drives the mounting base 4 in the Y-direction, and a Y-direction driving motor 6 which rotates the Y-direction guide axis 5. Also, the wiring forming device 20 is provided with a base 7 on which the X-direction guide axis 2 and the Y-direction guide axis 5 are fixed on respective predetermined positions thereon. A controlling device 8 is provided beneath the base 7. The wiring forming device 20 is further provided with a cleaning structure section 14 and a heater 15.

The ink jet head group 1 is provided with a plurality of ink jet heads which eject a dispersion liquid which contains a conductive particle from nozzles (ejection mouths) by a predetermined interval on the substrate. Additionally, it is possible to eject the dispersion liquid from these ink jet head separately according to an ejection voltage which is supplied from the controlling device 8. The ink jet head group 1 is fixed on the X-direction guide axis 2. The X-direction driving motor 3 is connected to the X-direction guide axis 2. The X-direction driving motor 3 is a stepping motor or the like so as to rotate the X-direction guide axis 2 when a driving pulse signal for the X-axis direction from the controlling device 8. Consequently, when the X-direction guide axis 2 is rotated, the ink jet head group 1 moves in the X-axis direction relatively to the base 7.

Figure 2A:
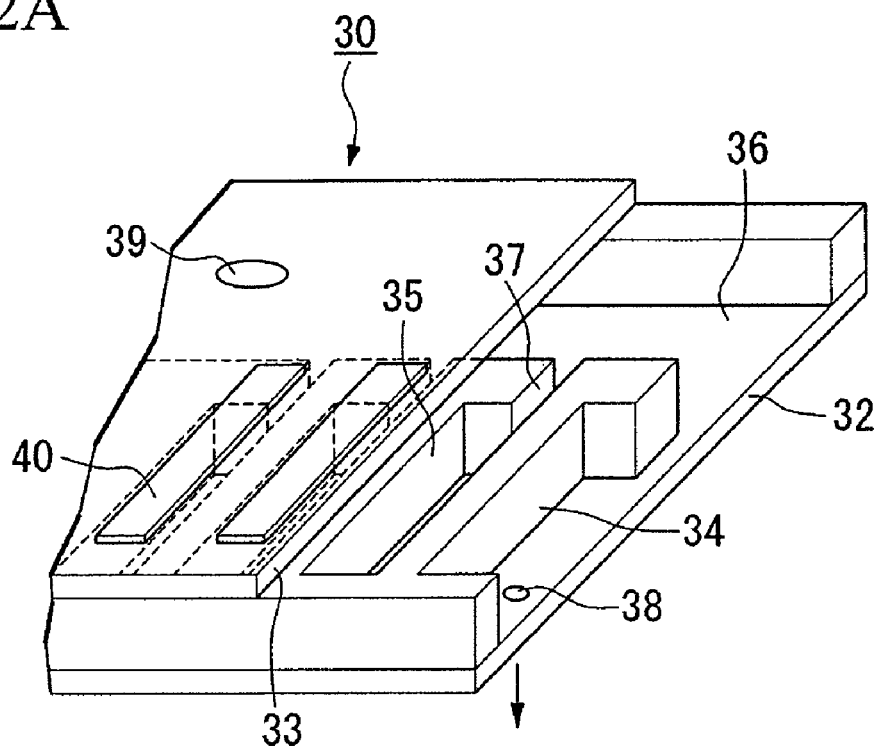
FIGS. 2A and 2B are views for explaining a general structure of a liquid drop ejecting head.

Here, a detail structure for a plurality of ink jet heads which form an ink jet head 1 is explained. FIGS. 2A to 3 show an ink jet head 30.

The ink jet head 30 is provided with, for example, a nozzle plate 32 which is made of a stainless steel and a vibration plate 33 in which the nozzle plate 32 and the vibration plate 33 are attached via a separating member (reserver plate) 34 as shown in FIG. 2A. A plurality of spaces 35 and a liquid reservoir are formed by the separating member 34 between the nozzle plate 32 and the vibration plate 33. An inside of the spaces 35 and the liquid reservoir 36 are filled with a liquid member such that the spaces 35 and the liquid reservoir 36 communicate with each other via a supply mouth 37. Also, a plurality of nozzle holes 38 for ejecting a liquid member from the space 35 are formed arrayed in a longitudinal direction and in a latitudinal direction on the nozzle plate 32. On the other hand, a hole 39 for supplying a liquid member to the liquid reservoir 36 therethrough is formed on the vibration hole 33.

Figure 2B:
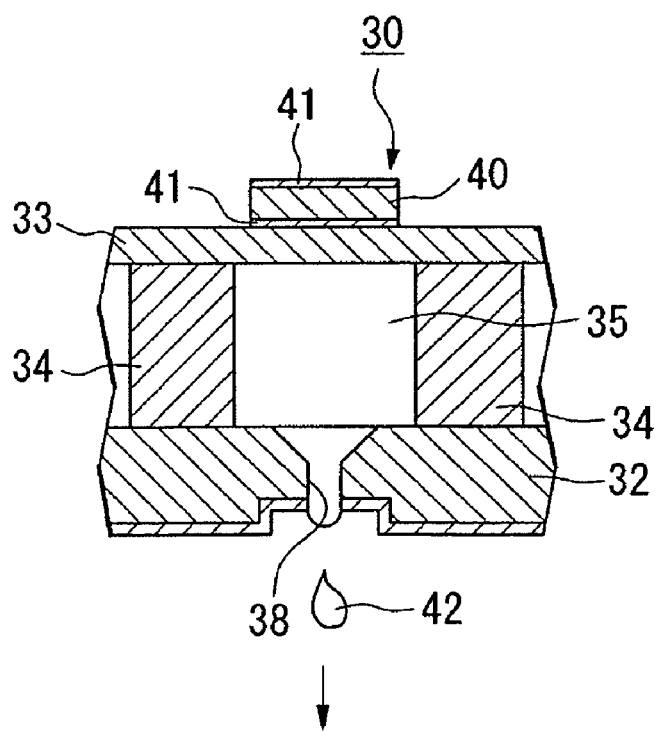
Figure 3:
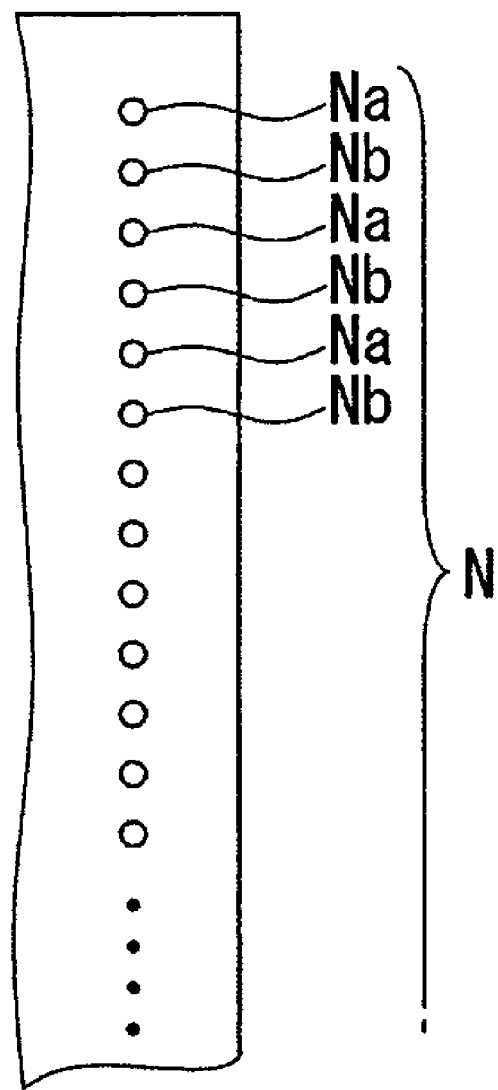
FIG. 3 is a view or a bottom surface of a liquid drop ejecting head.

Also, a piezoelectric element 40 is attached on an opposite surface of the vibration plate 33 to the space 35 as shown in FIG. 2B. The piezoelectric element 40 is disposed between a pair of electrodes 41 so as to protrude thereoutside and bend when electricity is conducted. By doing this, the vibration plate 33 to which the piezoelectric element 40 is attached bends thereoutside together with the piezoelectric element 40; thus, a volume in the space 35 increases. Therefore, a corresponding amount of the liquid member to the increased volume in the space 35 flows therein from the liquid reservoir 36 via the supply mouth 37. Also, when an electricity to the piezoelectric element 40 is turned off under such conditions, the piezoelectric element 40 and the vibration plate 33 recovers to initial shapes.

Thus, the volume inside of the space 35 recovers to an initial volume; therefore, a pressure in the liquid member in the space 35 increases. A liquid drop 42 is ejected toward a substrate from the nozzle hole 38 accordingly.

Here, a bottom shape of the ink jet head 30 having the above structure is approximate rectangle as shown in FIG. 3 in which nozzles N (nozzle holes 38) are disposed rectangularly in an equal interval both in longitudinal direction and in latitudinal direction. Furthermore, in the present embodiment, main nozzles (first nozzles) Na are disposed in nozzle arrays which are disposed in a longitudinal direction such that vice nozzles (second nozzles) Nb are disposed between the main nozzles.

A piezoelectric element 40 is formed in each nozzle N (nozzle Na, Nb) independently such that the ejection of the liquid drop is performed independently. That is, it is possible to adjust and change the ejection amount of the liquid drop from each nozzle N by controlling an electric signal for an ejection waveform which is sent to the piezoelectric elements 40. Here, the ejection waveform is controlled by a controlling device 8. By doing this, the controlling device 8 serves as an ejection amount adjusting section for changing the ejection amount from each nozzle N.

Here, a method used for the ink jet head 30 is not limited to a piezo-jet method in which the above piezoelectric element 40 is used. For example, it is possible to employ thermal method in which it is possible to change ejection amount of the liquid drop by changing a time for applying heat.

Returning to FIG. 1, the substrate 11 to which a dispersion liquid is ejected by the wiring forming device 20 is mounted on the base mount 4. The base mount 4 is provided with a structure for fixing the substrate 11 to a reference position. The mounting base 4 is fixed on the Y-direction guide axis 5. A Y-direction driving motors 6, 16 are connected to the Y-direction guide axis 5. The Y-direction driving motors 6, 16 are stepping motors or the like so as to rotate the Y-direction guide axis 5 when a driving pulse signal for the Y-axis direction from the controlling device 8. Consequently, when the Y-direction guide axis 5 is rotated, the base mount 4 moves in the Y-axis direction relative to the base 7.

The cleaning structure section 14 is provided with a structure which cleans the ink jet head group 1. The cleaning structure section 14 moves along the Y-direction guide axis 5 by the Y-direction driving motor 16. The movement of the cleaning structure section 14 is also controlled by the controlling device 8.

Heater 15 heats the substrate 11 by a lamp annealing operation. Here, the heating operation is for a purpose of vaporizing an drying the ejected liquid on the substrate and converting it to the conductive thin film. The controlling device 8 controls for turning the heater 15 on and off.

In order to eject a dispersion liquid in a predetermined wiring forming area in the wiring forming device 20 of the present embodiment, a predetermined diving pulse signal is supplied from the controlling device 8 to the X-direction driving motor 3 and/or the Y-direction driving motor 6, and the ink jet head group 1 and/or the mounting base 4 are moved; thus, the ink jet head group 1 and the substrate 11 (mounting base 4) are moved relatively. Consequently, during such a relative movement, an ejection voltage is supplied to a predetermined ink jet head in the ink jet head group 1 from the controlling device 8; thus, the dispersion liquid is ejected from the ink jet head.

In the wiring forming device 20 of the present embodiment, ejection of the liquid drop from each ink jet head group 1 can be adjusted according to an ejection voltage which is supplied from the controlling device 8. Also, a pitch of the ejected liquid drop on the substrate 11 is determined by a relative movement speed between the ink jet head group 1 and the substrate 11 (mounting base 4) and a frequency in which the liquid drops are ejected from the ink jet head group 1.

According to the wiring forming device 20 of the present embodiment, it is possible to realize a finer wiring and thicker thin film without causing a bulge while realizing a uniform thickness in the thin film with a desirable edge shape.

Therefore, according to the present embodiment, it is possible to form a conductive thin film wiring which is advantageous for an electric conductivity with a sufficient thickness in which defects such as disconnections and short circuits hardly occur in addition to its easy finer formability.

Next, an ejecting method (material disposition process) in which a wiring forming device 20 is used is explained with reference to FIGS. 4A to 11B.

In this process, a liquid drop which contains a material for forming a conductive thin film wiring is ejected on the substrate 11 from the ink jet head 30 in the wiring forming device 20 so as to form a linear thin film pattern (wiring pattern) on the substrate. The liquid material is made by dispersing conductive particles such as a metal material for forming a conductive thin film wiring in a dispersion medium as explained above.

In FIGS. 4A to 4C, the material disposing process comprises three steps. In a first step, a central section (central pattern) W1 in linear width direction of the thin film pattern W is formed on the substrate 11 by ejecting and disposing liquid drop made of a liquid material on the substrate 11 from the nozzle N in the ink jet head 30 in the wiring forming device 20 as shown in FIG. 4A. In a second step, a side section W2 (a first side section pattern) W2 is formed so as to be disposed in one side of the central pattern W1 which is formed on the substrate 11 as shown in FIG. 4B. In a third step, another side section (a second side section pattern) W3 is formed so as to be disposed in another side of the central pattern W1 which is formed on the substrate 11 as shown in FIG. 4C. Thus, a linear thin film pattern W is formed as shown in FIG. 4C by these first to third steps.

In the first step, as shown in FIG. 4A, a liquid drop for a liquid material is ejected from the ink jet head 30 so as to be disposed on the substrate 11 by a predetermined distance interval (pitch). Consequently, the linear central pattern W1 which forms a part of a thin film pattern W is formed in a central section of an area W4 in which the thin film pattern W4 is supposed to be formed on the substrate 11 by repeating such a disposing operation of the liquid drop. Here, a surface of the substrate 11 is treated so as to be water-repellant desirably in advance such that it is restricted that the liquid drop which is disposed on the substrate 11 may spread. Therefore, it is possible to control the pattern shape under a desirable condition reliably, and it is possible to form a thicker thin film easily.

Here, after the liquid drop which forms the central pattern W1 on the substrate 11 is disposed, a drying treatment is performed so as to remove the dispersion medium according to necessity. For a drying operation, any heating method can be used in which a common heating device such as a hotplate, an electric furnace, or a hot-air generating device is used. Also, a method in which a lamp annealing device is used is acceptable.

Next, in the second step, as shown in FIG. 4B, liquid drops for a liquid material are ejected from the ink jet head 30 so as to form the first side section pattern W2 which neighbors a side of the central pattern W1. Here, the ink jet head 30 ejects the liquid drops such that the ejected liquid drops and at least a part of the central pattern W1 which is formed on the substrate 11 overlap each other when the first side section pattern W2 is formed. By doing this, the liquid drops which form the central pattern W1 and the liquid drops which form the first side section pattern W2 are connected reliably; thus, an non-continuous section of a material for forming a conductive thin film wiring does not occur in the formed thin film pattern W. Consequently, the liquid drops are disposed on the substrate 11 by a constant pitch in the second step. By repeating such a disposition operation, the first side section pattern W2 which forms a part of a thin film pattern is formed in a side of an area W4 in which the thin film pattern W is supposed to be formed; thus, a central pattern W1 and the first side section pattern W2 are formed unitarily.

Here, an intermediate drying operation is performed so as to remove the dispersion medium according to necessity after liquid drops are disposed for forming a first side section pattern W2 on the substrate 11.

Next, in a third step as shown in FIG. 4C, liquid drops for a liquid material are ejected from the ink jet head 30; thus, a linear second side section pattern W3 is formed which neighbors the other side of the central pattern W2. Here, liquid drops are ejected from the ink jet head 30 such that at least some of the ejected liquid drops and the central pattern W1 which is formed on the substrate 11 overlap when the second side section pattern W3 is formed. By doing this, the central pattern W1 and the liquid drop which forms the second side section pattern W3 are connected reliably; therefore, a non-continuous part of a material for forming a conductive thin film wiring is not generated in the formed thin film pattern W. By doing this, the central pattern W1 and the second side section pattern W3 are formed unitarily, and three linear patterns W1, W2, and W3 are formed unitarily; therefore, a wide thin film pattern W is formed. In addition, the liquid drops are also disposed on the substrate at a constant pitch in the third step. By repeating such a disposition operation, a second side section pattern W3 which forms a part of the thin film pattern W is formed on another side section of the area W4 in which the thin film pattern W is supposed to be formed.

In such a case, it is possible to control the final width of a line in the linear thin film pattern W by adjusting an ejection position (distance from the central pattern W) of the liquid drops which are ejected in the second and the third steps. Also, it is possible to control the thickness of the unitarily formed thin film pattern W by changing height (thickness) of a plurality of patterns W1, W2, and W3 formed in the first, second, and the third step respectively from a surface of the substrate 11.

Next, method for forming linear central pattern W1, and side section patterns W2, and W3 is explained with reference to FIGS. 5A to 5C.

Figure 5A:
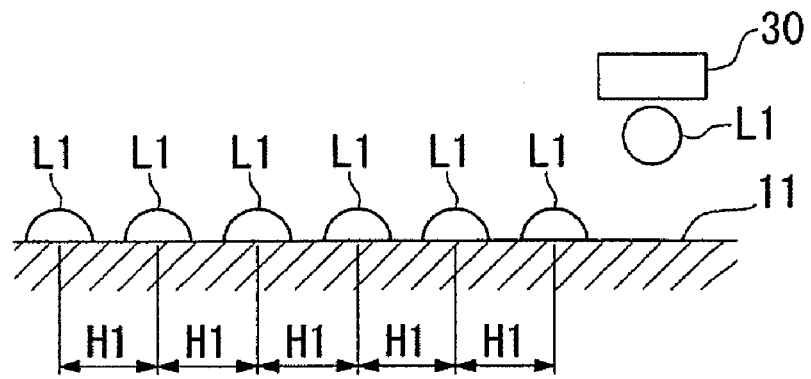
FIGS. 5A to 5C are views for showing an embodiment for a method for forming a pattern.

First, as shown in FIG. 5A, a liquid drop L1 which is ejected from the ink jet head 30 is disposed on a substrate 11 sequentially by a predetermined interval. That is, the ink jet head 30 disposes the liquid drops on the substrate 11 such that the liquid drops overlap each other (first disposing step). In the present embodiment, the disposition pitch H1 of the liquid drop L1 is set so as to be larger than a diameter of the ejected liquid drop L1 on the substrate 11. By doing this, the ejected liquid drops L1 which are disposed on the substrate 11 do not overlap (contact) each other; thus, it is avoided that the liquid drops L1 are formed unitarily each other and spread on the substrate 11. Also, the disposition pitch H1 between the liquid drops L1 is set to be not greater than twice as large as a diameter of the ejected liquid drop which is disposed on the substrate 11.

Here, after the liquid drop L1 is disposed on the substrate 11, a drying operation may be performed so as to remove a dispersion medium according to necessity. The drying operation can be performed, for example, by using an ordinary method using a hot plate, an electric furnace, or a hot wind generating device, or by a lamp annealing method. In such cases, although it is acceptable if the dispersion medium is removed and the dispersion medium is converted to a conductive thin film by increasing a heat and a light which are ejected, such an operation should be performed only until the dispersion medium is removed to some extent.

Figure 5B:
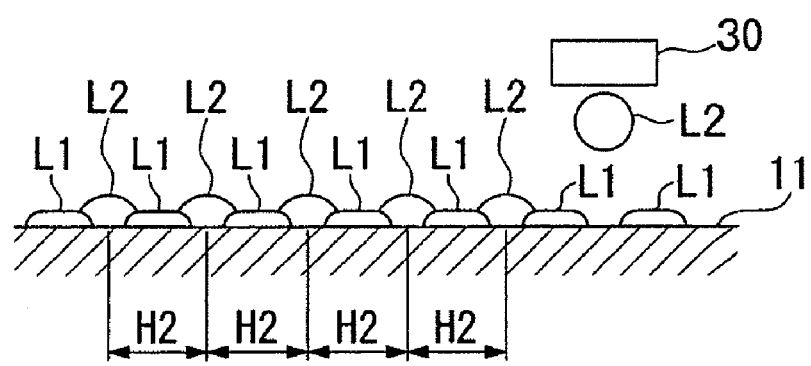

Next, as shown in FIG. 5B, the above disposition operation of the liquid drop is repeated. That is, similarly as a previous disposition shown in FIG. 5A, a liquid material is ejected for a liquid drop L2 from the ink jet head 30; thus, the liquid drop L2 is disposed on the substrate 11 by a constant distance. In such a case, volume of the liquid drop L2 (amount of liquid material for a liquid drop) and its disposition pitch H2 are the same as those for the liquid drop L1 in the previous disposition operation. Consequently, the disposition of the liquid drop L2 is shifted from the previous disposition of the liquid drop L1 by ½ pitch; thus, the liquid drop L2 is disposed (second disposition step) in a middle of the liquid drops L1 which are disposed previously on the substrate 11.

As explained above, the disposition pitch H1 of the liquid drop L1 on the substrate 11 is larger than a diameter of the ejected liquid drop L1 which is disposed on the substrate 11 and not greater than twice as large as the diameter. Therefore, the liquid drop L2 is disposed in the middle of the liquid drops L1; thus, a part of the liquid drop L2 overlap the liquid drop L1, and a space between the liquid drops L1 is filled. In such a case, the liquid drop L2 which is ejected latest contacts the liquid drop which is ejected previously. However, the dispersion medium is removed from the previous liquid drop L1 completely, or to some extent; thus, it does not occur that the liquid drop L1 and the liquid drop L2 are disposed unitarily to spread on the substrate 11.

Here, in FIG. 5B, explanations are made under condition that a starting position for disposing the liquid drop L2 is set at the same position as the previous disposition operation (left hand side for a viewer of the FIG. 5A). More importantly, it is possible to set the starting position is set at opposite position (right hand side in the drawing). It is possible to reduce a distance for a relative movement by the ink jet head 30 and the substrate 11 by ejecting the liquid drop when a movement is made in each direction in a reciprocating movement.

After the liquid drop L2 is disposed on the substrate 11, it is possible to perform a drying operation for removing a dispersion medium according to necessity, as similarly to the previous case.

By repeating such a series of disposition operation of the liquid drop by plural times, space between the liquid drops which are disposed on the substrate 11 is filled. As shown in FIG. 5C, a linear continuous central pattern W1, and side section patterns W2, W3 are formed on the substrate 11. In such a case, by increasing repetition of the disposition operation for the liquid drops, the liquid drops overlap sequentially on the substrate 11; thus, the thickness of the patterns W1, W2, and W3 increase such as their height (thickness) from a surface of the substrate 11 increases. The height (thickness) of the linear patterns W1, W2, and W3 is set according to a desirable thickness of the thin film which is necessary for a final thin film pattern. The repetition for the disposition operation for the above liquid drops is set according to the thickness of the thin film which is set as above.

Figure 5C:
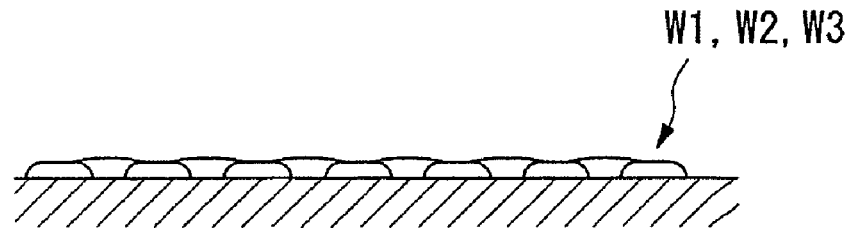

Here, a method for forming the linear pattern is not limited to cases shown in FIGS. 5A to 5C. For example, it is possible to set a shift amount desirably when the liquid drops are disposed and the disposition operation is repeated; thus, it is acceptable if the disposition pitch of the liquid drop is set differently on the substrate 11 when the patterns W1, W2, and W3 are formed. For example, if the pitch of the liquid drop is H1 when the central pattern W1 is formed, it is acceptable if the pitch of the liquid drops is larger than pitch H1 (for example, H1×2). It is surely important that the pitch of the liquid drops be smaller than pitch H1 (for example, H1×0.5). Also, it is acceptable if the volume of the liquid drops for forming the patterns W1, W2, and W3 are set differently. Otherwise, it is acceptable if a material disposition environmental condition such as an atmosphere for disposing the liquid drop (temperature and humidity) in which the substrate 11 and the ink jet head 30 are disposed in each of the steps 1, 2, and 3 is set differently from each other.

Here, in the present embodiment, a plurality of side section patterns W2 and W3 are formed one by one. More importantly, it is acceptable that a plurality of side section patterns W2 and W3 be formed simultaneously. Here, there is a possibility in that a total of drying operations may differ between a case in which a plurality of side section patterns W2 and W3 are formed one by one or in a case in which a plurality of side section patterns W2 and W3 are formed simultaneously. Therefore, a condition for the drying operation should be set such that a volatility on the substrate 11 may not be deteriorated.

Here, in the present embodiment, although a central pattern W1 is formed in the first step, it is acceptable that a plurality of, for example, two central patterns W1 are formed. Consequently, it is possible to form a wider thin film pattern easily by ejecting the liquid drops on both side sections of a plurality of central patterns W1 repeatedly.

Next, an example for an order for ejecting the liquid drop on the substrate is explained with reference to FIGS. 6A to 9. As shown in these drawings, a bit map which has a plurality of lattice pixels as a unit area to which a liquid drop for a liquid material is ejected is set on the substrate 11. The ink jet head 30 ejects the liquid drop to a pixel position which is set in the bit map. Here, a pixel is set to be in a square. Also, the ink jet head 30 ejects the liquid drop from nozzles N while scanning in Y-axis direction to the substrate 11. Consequently, in the explanation with reference to FIGS. 6A to 9, "1" is added to a liquid drop which is ejected in a first scanning operation. "2" is added to a liquid drop which is ejected in a second scanning operation. Also, "3" is added to a liquid drop which is ejected in a third scanning operation. Similarly, "n" is added to a liquid drop which is ejected in an n scanning operation. Also, in explanations below, a thin film pattern W is formed by ejecting a liquid drop in a hatched section (area in which a pattern is supposed to be formed) in FIGS. 6A and 6B.

Figure 6A:
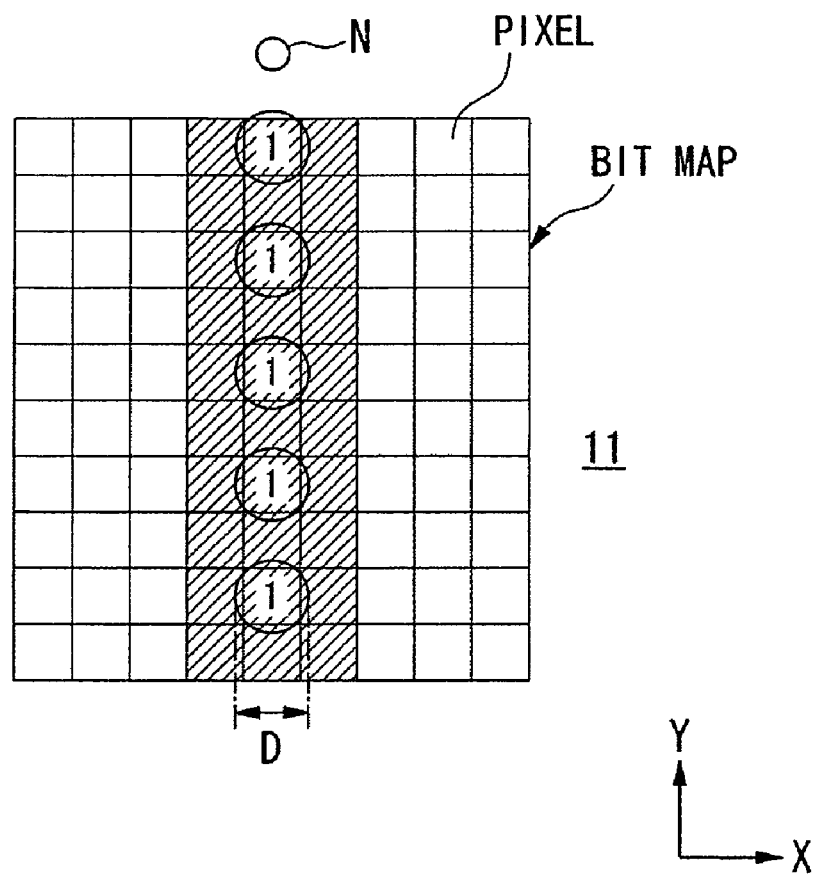
FIGS. 6A and 6B are views for showing a disposition of liquid drops on a substrate.

As shown in FIG. 6A, a liquid drop is ejected while a space which has a corresponding area for a pixel is formed in an area in which a central pattern is supposed to be formed so as to form the central pattern W1 in a first scanning operation. Here, the liquid drop which is ejected to the substrate 11 spreads on the substrate 11 when it is ejected on the substrate 11. That is, as shown in FIG. 6A, the liquid drop which is ejected on the substrate 11 spreads on the substrate such that a diameter of the ejected liquid drop becomes larger than a pixel. Here, the liquid drop is ejected in Y-axis direction by a predetermined interval (a pixel); thus, the liquid drops which are disposed on the substrate 11 do not overlap each other. By doing this, it is possible to prevent that an excessive amount of liquid material is disposed on the substrate in the Y-axis direction; thus, it is possible to prevent a bulge from occurring.

Here, in FIG. 6A, although the liquid drops which are disposed on the substrate 11 do not overlap each other, it is acceptable if the liquid drops are disposed while overlapping each other slightly. Also, although the liquid drops are ejected while forming a space having an area which corresponds to a pixel, it is acceptable if the liquid drops are ejected while forming a space having an area which corresponds to a plurality of pixels. In such a case, a space between the liquid drops on the substrate 11 should be filled by increasing a scanning operation and an ejecting operation by the ink jet head 30 to the substrate 11.

Figure 6B:
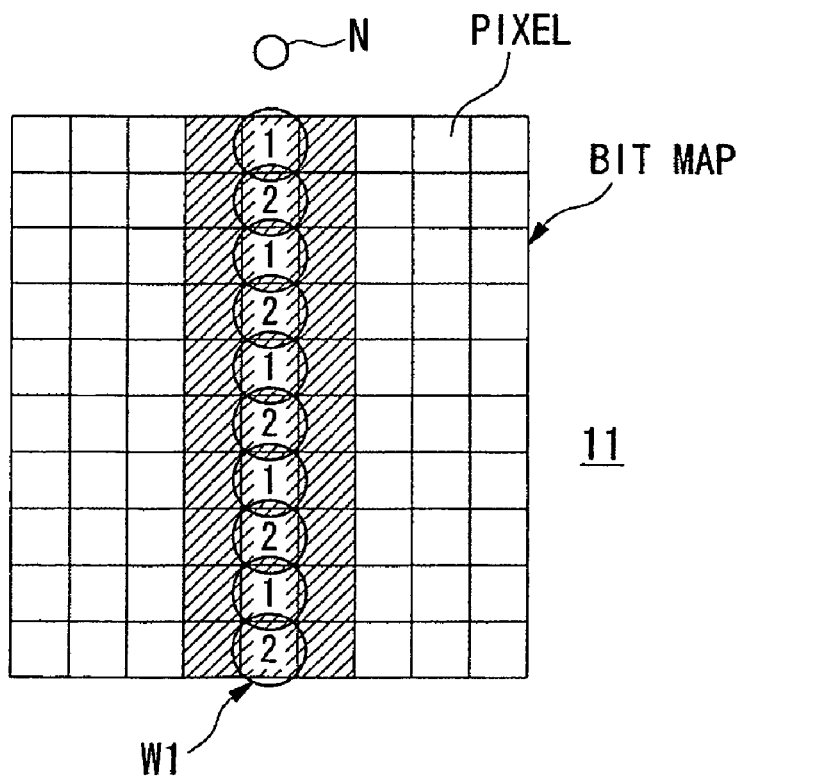

FIG. 6B shows the liquid drops which are ejected on the substrate 11 from the nozzle N in the ink jet head 30 in the second scanning operation. Here, in FIG. 6B, "2" is added to a liquid drop which is ejected in the second scanning operation. The liquid drop is ejected in the second scanning operation such that the liquid drop fills a space between the liquid drops 1 which are ejected in the first scanning operation. Consequently, the liquid drops becomes continuous by the first and the second scanning operations and ejection operations; thus, a central pattern W1 is formed.

Figure 7A:
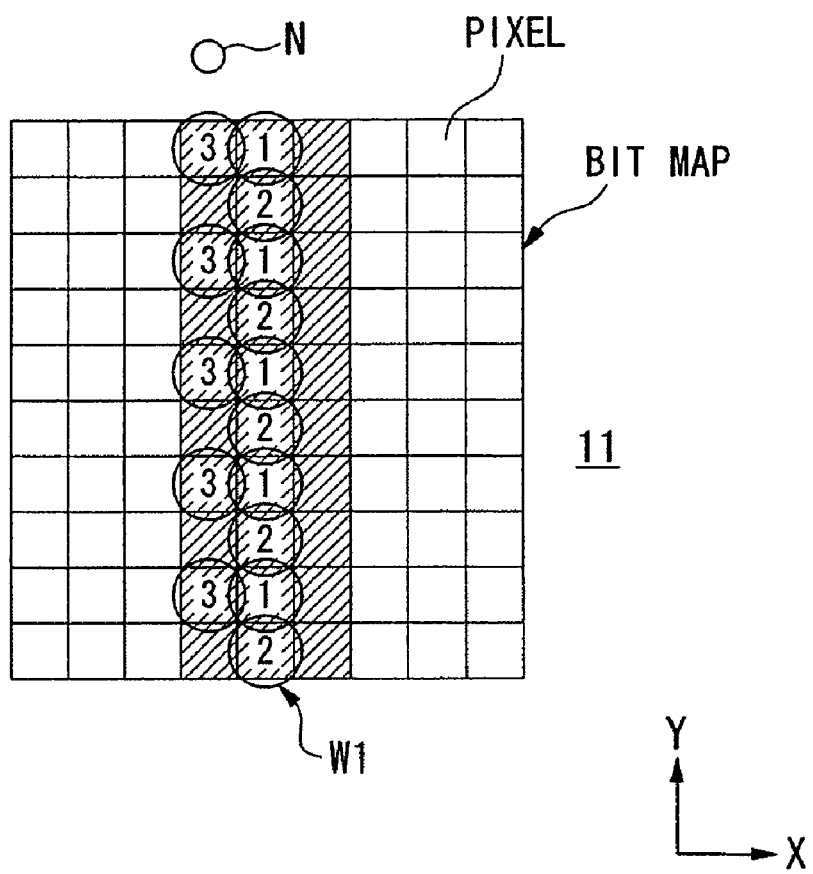
FIGS. 7A and 7B are views for showing a disposition of liquid drops on a substrate.

Next, the ink jet head 30 and the substrate 11 move relatively in the X-axis direction by a space having a corresponding area to a pixel. Here, the ink jet head 30 makes a step movement toward the substrate 11 in –X-axis direction by a space having an area which corresponds to a pixel. Consequently, the ink jet head 30 performs a third scanning operation. By doing this, as shown in FIG. 7A, liquid drops "3" which form the first side section pattern W2 are disposed on the substrate 11 such that the liquid drop "3" neighbors to the central pattern W 1 so as to be in the X-axis direction. Here, the liquid drops "3" are disposed so as to have a pixel therebetween in the Y-axis direction. Here, the liquid drops "3" which are disposed in a first scanning operation after the step movement of the ink jet head 30 in the X-axis direction (that is, in a third scanning operation in an overall scanning operation) are disposed so as to neighbor the liquid drops "1" which are disposed in the first scanning operation before the step movement in the X-axis.

Figure 7B:
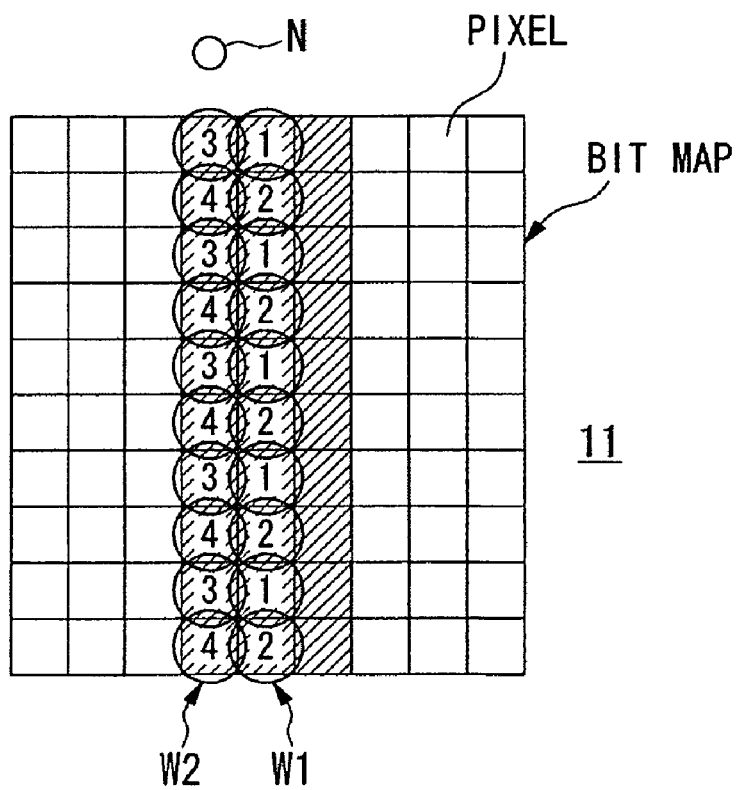

FIG. 7B shows liquid drops which are ejected on the substrate 11 from the ink jet head 30 in a fourth scanning operation. Here, in FIG. 7B, "4" is added to the liquid drop which is ejected in a fourth scanning operation. In the fourth scanning operation, the liquid drop is ejected so as to fill a space between the liquid drops "3" which are ejected in the third scanning operation. Consequently, the liquid drops become continuous in the third and the fourth scanning operations and the ejecting operations; thus, a first side section pattern W2 is formed. Here, the liquid drop "4" which is ejected in the second scanning after the step movement (that is, a fourth scanning operation in an overall process) is disposed so as to neighbor the liquid drop "2" in the X-axis which is ejected in the second scanning operation before the step movement.

Figure 8A:
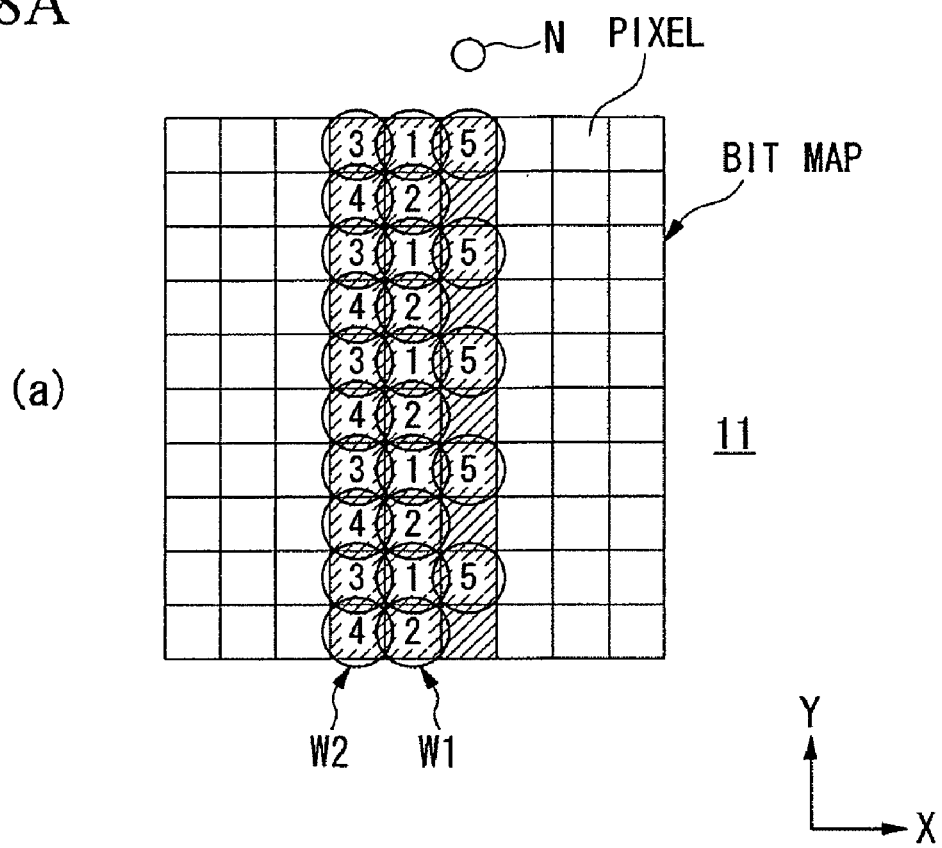
FIGS. 8A and 8B are views for showing a disposition of liquid drops on a substrate.

Next, the ink jet head 30 and the substrate 11 move relatively in the X-axis direction by two pixels. Here, the ink jet head 30 makes a step movement by two pixels in +X-axis direction toward the substrate. Consequently, the ink jet head 30 performs a fifth scanning operation. By doing this, as shown in FIG. 8A, liquid drops "5" which form a second side section pattern W3 are formed on the substrate so as to neighbor the central pattern W in +X-axis direction. Here, the liquid drops "5" are disposed so as to have a pixel therebetween in the Y-axis direction. Here, the liquid drops "5" which are ejected in the fifth scanning operation after the step movement of the ink jet head 30 in the X-axis direction are disposed so as to neighbor the liquid drops "1" in the X-axis.

Figure 8B:
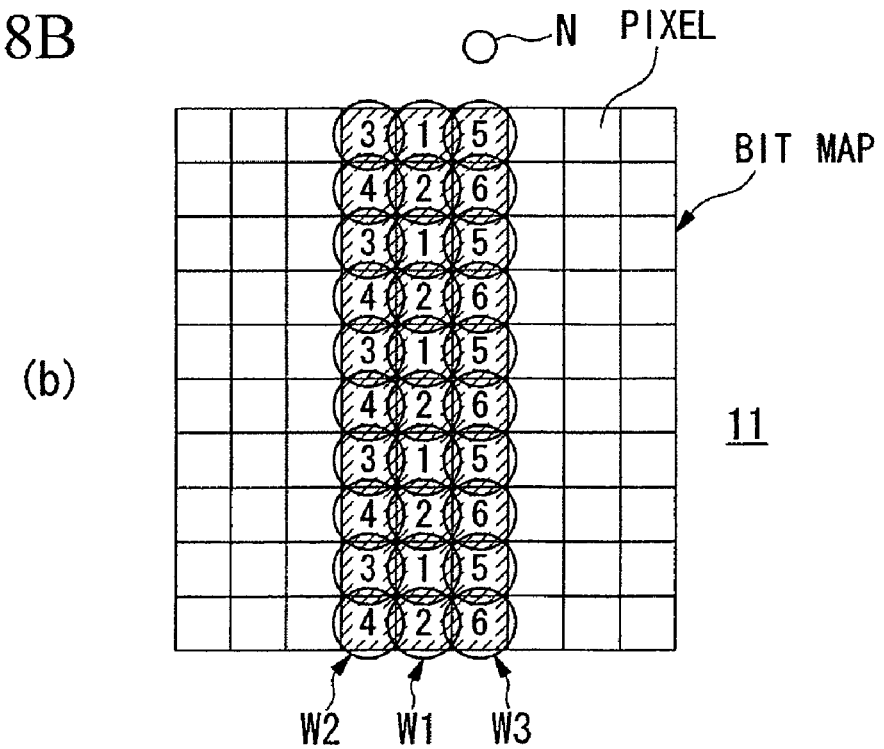

FIG. 8B shows the liquid drops which are ejected on the substrate 11 from the ink jet head 30 in a sixth second scanning operation. Here, in FIG. 8B, "6" is added to a liquid drop which is ejected in the sixth scanning operation. The liquid drop is ejected in the sixth scanning operation such that the liquid drop fills a space between the liquid drops 5 which are ejected in the fifth scanning operation. Consequently, the liquid drops become continuous by the fifth and sixth scanning operations and ejection operations; thus, a second side section pattern W3 is formed. Here, the liquid drops "6" in the sixth scanning operation are disposed so as to neighbor the liquid drop "2" in the X-axis.

Figure 9:
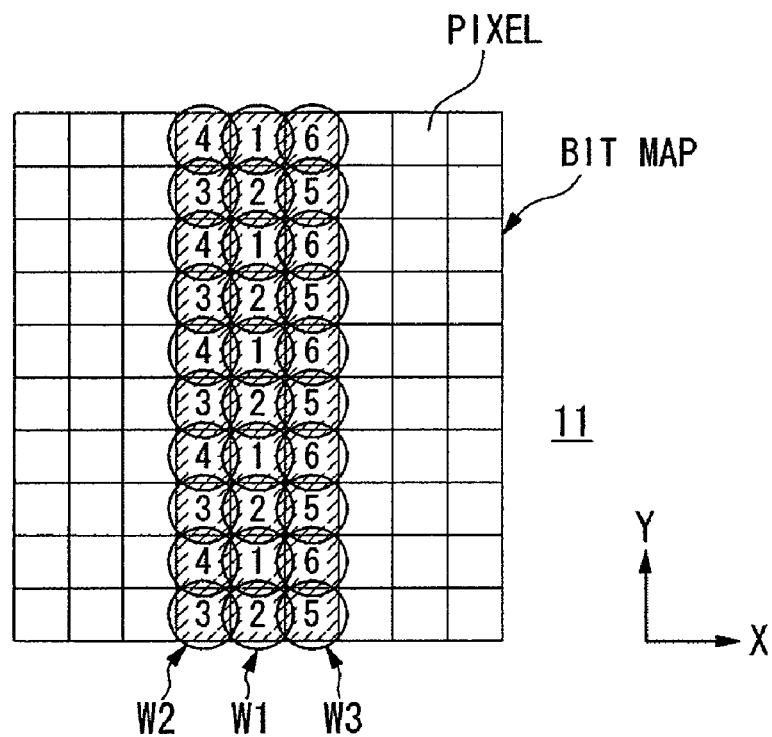
FIG. 9 is a view for showing a disposition of liquid drops on a substrate.

FIG. 9 show an example in which a different disposing order for ejecting the liquid drop is shown. In FIG. 9, a liquid drop "4" which is ejected in the second scanning operation (fourth scanning operation in an overall process) after the step movement of the ink jet head 30 in the X-axis direction is disposed so as to neighbor the liquid drop "1" which forms the central pattern W1 in –X-axis direction in the X-axis. On the other hand, a liquid drop "3" which is ejected in the first scanning operation (third scanning operation in an overall process) after the step movement of the ink jet head 30 in the X-axis is disposed so as to neighbor the liquid drop "2" which forms the central pattern W1 in –X-axis direction in the X-axis. Similarly, the liquid drop "6" which is ejected in the sixth scanning operation in an overall process is disposed so as to neighbor the liquid drop "1" in +X-axis direction in the X-axis. On the other hand, the liquid drop "5" which is ejected in the fifth scanning operation in an overall process is disposed so as to neighbor the liquid drop "2" which forms the central pattern W1 in +X-axis direction. In this way, it is acceptable if the positions for ejecting the liquid drops for forming the lines W1, W2, and W3 are different from each other.

Figure 10:
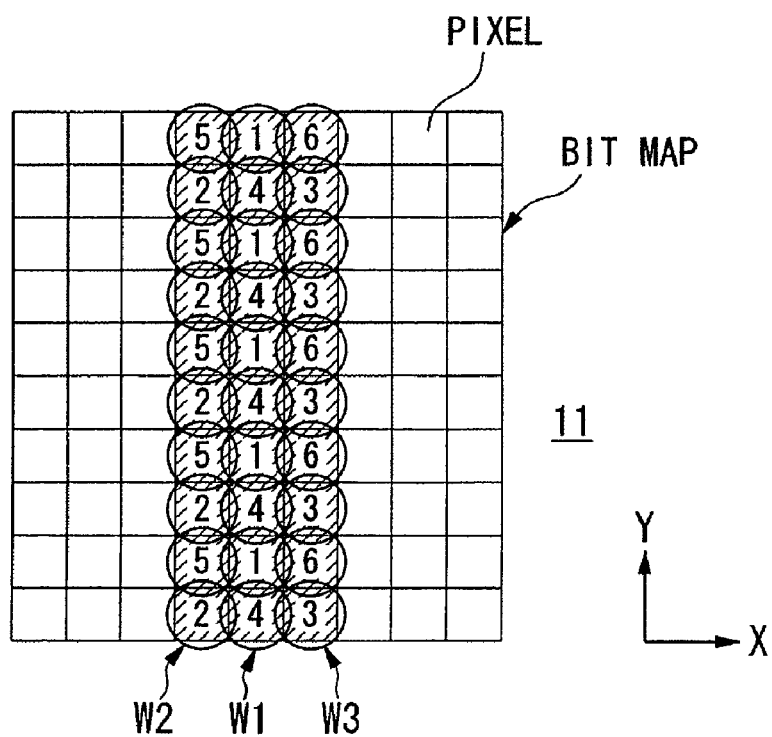
FIG. 10 is a view for showing a disposition of liquid drops on a substrate.

Furthermore, as shown in an example in FIG. 10, the following order is acceptable. That is, first, the liquid drop "1" for forming the central pattern W1 is disposed. After that, the ink jet head 30 is moved in a stepped manner. The liquid drop "2" for forming the first side section pattern W2 is disposed. Next, the ink jet head 30 is moved in a stepped manner; thus the liquid drop "3" for forming the second side section pattern W2 is disposed. Consequently, the liquid drops "4", "5", and "6" are ejected sequentially so as to fill the spaces thereamong. As explained above, it is acceptable if operations for forming the side section patterns W2 and W3 be started even if the side section patterns W2, and W3 are not formed after the central pattern W1 is formed completely.

Figure 11A:
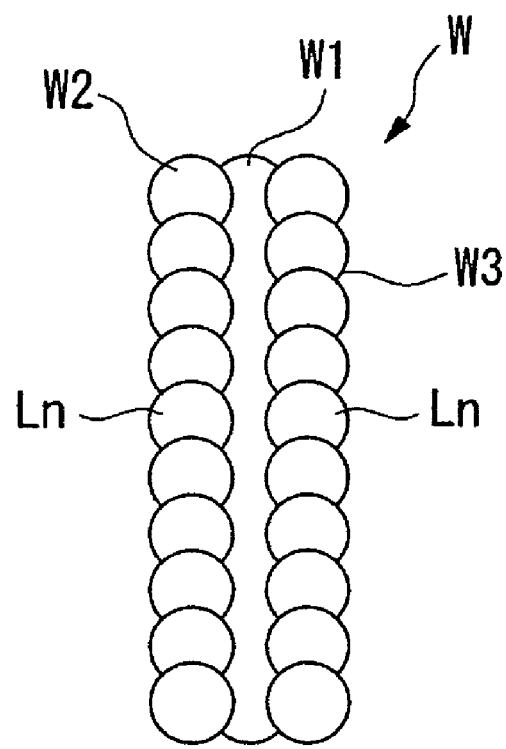
FIGS. 11A and 11B are views for showing another embodiment of a method for forming a pattern.
Figure 11B:
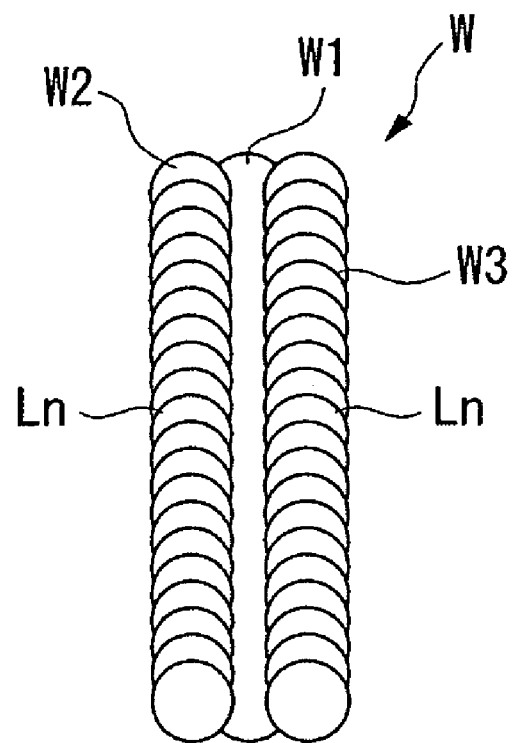

FIGS. 11A and 11B show an example for disposing a liquid drop for forming the first side section pattern W2 and the second side section pattern W3 on both sides of the central pattern W1 in the above second step and the third step. In an example shown in FIG. 11A, the central pattern W1 is formed under the same condition as the ejection condition (disposition condition) which is explained with reference to FIGS. 5A to 5C. On the other hand, ejection condition in the second and the third steps is different from the ejection condition for forming the central pattern W1. More specifically, volume of the liquid drop Ln is set to be larger than that of the first step. That is, an increased amount of the liquid material which is ejected. Here, in the present example, the disposition pitch for the liquid drops Ln is the same as that in the first step. It is possible to shorten a time for forming the thin film pattern W by increasing the volume of the liquid drop Ln; thus, it is possible to improve a product yield. When the volume of the liquid drop becomes larger, a bulge occurs easily. For such a case, a condition for a liquid drop volume in which a bulge does not occur should be calculated in advance according to a characteristic of a material for the liquid material, and a maximum volume for ejecting the liquid drop should be set according to such a calculated condition.

In an example shown in FIG. 11B, an ejection condition in the second and the third steps such as a disposition pitch for the liquid drop Ln is narrower than that in the first step. Here, it is acceptable if the volume of the liquid drop Ln is the same as that in the first step. Also, it is acceptable if the volume of the liquid drop Ln is larger than that in the first step as shown in FIG. 11A. Disposition amount of the liquid drop increases for a unit area by narrowing the disposition pitch for the liquid drop; thus, it is possible to form the pattern in a shorter time.

Third Embodiment

For a third embodiment of the present invention, a method for forming a silicon thin film pattern is explained for an example for a thin film pattern forming method. A method for forming a silicon thin film pattern of the present embodiment comprises the steps for performing a surface treatment, ejecting a liquid drop, and performing thermal treatment/optical treatment. Each step is explained as follows.

(Surface Treatment Process)

For a substrate 11 which forms a silicon thin film pattern, various material such as a Si wafer, a silica glass, a glass, a plastic film, and a metal plate can be used. A base layer such as a semiconductor layer, a metal layer, a dielectric layer, and an organic layer is formed on a surface of the above material substrate so as to be a substrate on which a silicon thin film pattern is supposed to be formed.

A volatility (wettability) of a surface of the substrate on which the silicon thin film pattern is supposed to be formed should preferably be controlled so as to correspond to a liquid which contains the conductive particle. More specifically, a contact angle of the liquid to a surface of the substrate should preferably be in a range of 15° to 45°. Furthermore, in order to determine a setting value for a contact angle in the above range, first, a type of a substrate on which a conductive thin film wiring is supposed to be formed and a type of liquid drop which is employed are determined. A relationship between the contact angle and a diameter of the ejected liquid drop on the substrate are determined based on the above condition. Thus, the contact angle is determined according to the diameter of the liquid drop.

By doing this, a method for a surface treatment for realizing a desirable contact angle is the same as that in the first embodiment; thus, duplication of explanations are omitted.

(Ejection Process)

When a silicon thin film pattern is formed, a liquid which contains an organic silicon compound is used. A liquid in which an organic silicon compound is dissolved in a solvent is used as a liquid which contains an organic silicon compound. The organic silicon compound which is used in this case is a silane compound which has a ring system which is indicated by a general expression such as $Si_nX_m$ (here, X indicates a hydrogen atom and/or halogen atom, n indicates an integer which is not smaller than 3, m indicates an integer which is n, 2n−2, 2n, or 2n+2).

Here, although n is not less than 3, it is preferable that a ring silane compound having n in a range of 5 to 20, more preferably such as 5 or 6, from a thermodynamic stability, dissolution characteristics, and a refinery point of view. If n is not greater than 5, the silane compound becomes unstable because of a distortion due to a ring; thus, it is difficult to handle the silane compound. Also, if n is greater than 20, a dissolution characteristics decreases due to an aggregation of the silane compound; thus there will be fewer choices for the solvent.

Also, in a general expression such as $Si_nX_m$ which is used in the present invention, X indicates a hydrogen atom and/or a halogen atom. These silane compounds are precursor compounds for a silicon thin film; therefore, it is necessary to form an amorphous or poly-crystal silicon in the thermal treatment and/or the optical treatment finally. Silicon-hydrogen bonding and silicon-halogen bonding cleave in the above processes; thus, there occurs silicon-silicon bonding so as to become a silicon finally. Such a halogen atom is usually a fluoride atom, chlorine atom, bromine atom, and iodine atom. It is acceptable that X is a single hydrogen atom or a single halogen atom. Also, it is acceptable that X is a partially halogenized silane compound such that a total of the hydrogen atom and the halogen atom is m.

Furthermore, for these silane compounds, a chemical compound which is denaturalized by a third family or a fifth family such as boron or phosphor can be used according to necessity. For such a denaturalized silane compound, it is preferable to use a silane compound which does not contain a carbon atom. For such a denaturalized single compound, a denaturalized silane compound which is indicated by a general expression such as $Si_aX_bY_c$ (here, X indicates a hydrogen atom and/or a halogen atom, Y indicates a boron atom or a phosphor atom, a indicates an integer which is greater than 3, b indicates an integer which is in a range of a and 2a+c+2, and c is an integer which is in a range of 1 and a) can be mentioned. Here, a denaturalized silane compound in which a total of a and c is in a range of 5 to 20, in particular, a total of a and c is 5 or 6 is preferable from a thermodynamics stability, dissolution characteristics, and a refinery point of view. If a+c is not greater than 5, the silane compound becomes unstable because of a distortion due to a ring; thus, it is difficult to handle the silane compound. Also, if a+c is greater than 20, a dissolution characteristics decreases due to an aggregation of the silane compound; thus there will be fewer choices for the solvent.

Also, in a general expression such as $Si_aX_bY_c$ which is used in the present invention, X indicates a hydrogen atom and/or a halogen atom as similar to a case for the X in a general expression for a non-denaturalized silane compound which is indicated by $Si_nX_m$. The X usually indicates a fluoride atom, chlorine atom, bromine atom, and iodine atom. It is preferable that the X be a chlorine or a bromine. It is acceptable that X is a single hydrogen atom or a single halogen atom. Also, it is acceptable that X is a partially halogenized silane compound such that a total of the hydrogen atom and the halogen atom is b.

It is preferable that a vapor pressure of a dispersion medium which contains a conductive particle in a room temperature is in a range of 0.001 mmHg to 200 mmHg (approximately in a range of 0.133 Pa to 26,600 Pa). If the vapor pressure is greater than 200 mmHg, the dispersion medium vaporizes rapidly after the ejection; thus, it is difficult to form a superior thin film.

Also, a vapor pressure of the dispersion medium is preferably in a range of 0.001 mmHg to 50 mmHg (approximately in a range of 0.133 Pa to 6,650 Pa). If the vapor pressure is greater than 50 mmHg, a nozzle may be clogged often when liquid drops are ejected according to the ink jet method; thus, it is difficult to perform a stable ejection. On the other hand, in a case of a dispersion medium in which the vapor pressure is lower than 0.001 mmHg, it takes time for drying operation; thus, a dispersion medium may remain in the thin film. Therefore, it is difficult to realize a superior conductive thin film after a thermal treatment and/or an optical treatment later.

There is no limitation on solvents to be used as long as it is possible to dissolve the above organic silicon compound. It is possible to name a solvent which contains a hydrocarbons such as n-heptane, n-octane, decane, toluene, xylene, cymene, durene, indene, dipentene, tetrahydronaphthalene, decahydronaphthalene, and cyclohexylbenzene, ether solvents such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-ethoxyethyl) ether, p-dioxane, and polar solvents such as propylene carbonate, γ-butyrolactone, N-methyl-2-pyrrolidone, dimethylformamide, dimethylsulfoxide, and cyclohexanone.

Among these solvents, hydrocarbon solvent and ether solvent are preferable from a solvency for the organic silicon compound and the solvent's stability point of view. As further preferable solvents, and dispersion media, it is possible to mention hydrocarbon solvent. These solvents can be used independently or in combination with other solvents as a mixture.

A solution mass density for solving the above organic silicon compound in the solvents is in a range of 1 mass % and 80 mass %. Such a solution mass density can be adjusted according to a desirable thickness of a silicon thin film. If the solution mass density exceeds 80 mass %, an aggregation may easily occur, thus, it is difficult to realize a uniform thin film.

It is preferable that a surface tension of the solvent of the above organic silicon compound is in a range of 0.02 N/m to 0.07 N/m. If the surface tension is not greater than 0.02 N/m when a liquid is ejected according to the ink jet method, a wettability of the ink formation to the nozzle surface increases; thus, there occurs a flying curve easily. Therefore, a meniscus shape on a tip of the nozzle is not stable when a surface tension of the solvent of the above organic silicon compound is greater than 0.07 N/m; thus, it is difficult to control an ejecting amount and ejecting timing.

It is possible to dope a small amount of surface tension adjusting agent such as an agent containing a fluoride, a silicon, or a nonion to the above solvent for adjusting a surface tension unless a contact angle to the substrate decreases undesirably. A surface tension adjusting agent containing a nonion improves a wettability of the liquid to the substrate and a leveling characteristics of the thin film, and prevents roughening from occurring on a thin film. The above dispersion liquid may contain an organic compounds such as alcohol, ether, ester, and ketone according to necessity.

It is preferable that a viscosity of the above solvent is in a range of 1 mPa·s and 50 mPa·s. If a viscosity is smaller than 1 mPa·s when the dispersion liquid is ejected according to the ink jet method, it may occur that a periphery of the nozzle is contaminated by an overflowing ink. Also, if the viscosity is greater than 50 mPa·s, it occurs frequently that the nozzle hole is clogged; thus, it is difficult to eject the liquid drop smoothly.

In the present embodiment, a liquid drop of the above solvent is ejected from an ink jet head so as to drop on a position in which a wiring is supposed to be formed on the substrate. In this case, it is necessary to control an overlap of the liquid drops which are ejected continuously such that a liquid bulge is not formed. Also, it is possible that a plurality of liquid drops are ejected distantly so as not to contact each other in a first ejection, and liquid drops are ejected to the spaces therebetween in a second ejection or later.

After the liquid drop is ejected, a drying operation is performed so as to remove a solvent according to necessity. The drying operation can be performed, for example, by using an ordinary hot plate or an electric furnace for heating a substrate 11, or by a lamp annealing method. An light source for the lamp annealing method is not limited to a particular light source. For example, an infrared ray lamp, a xenon lamp, a YAG laser, an argon laser, a carbonic acid gas laser, and an excimer laser such as XeF, XeCl, XeBr, KrF, ArF, or ArCl can be used for the light source. These light sources are used when its output is in a range of 10 W to 5000 W. In the present embodiment, it is sufficient if a light source has an output in a range of 100 W to 1000 W.

(Thermal Treatment/Optical Treatment)

It is necessary to remove a solvent from the solution and convert the organic silicon compound to an amorphous silicon or a poly-crystal silicon. Therefore, a thermal treatment and/or an optical treatment are performed on the substrate after the ejection process.

The thermal treatment and/or the optical treatment can be performed in an inert atmosphere such as a nitride, argon, and helium. A temperature for the thermal treatment and/or the optical treatment is determined preferably according to factors such as a boiling point (vapor pressure) of the dispersion medium, type and pressure of the atmospheric gas, a thermal behavior of the particle such as a dispersion and an oxidization, whether or not there is a coating agent, and a heat-resistant temperature of the base member.

Usually, the thermal treatment and/or optical treatment are performed in an argon atmosphere, or in argon which contains hydrogen, at 100 to 800° C. of temperature. More preferably, the thermal treatment and/or optical treatment are performed in at 200 to 600° C. of temperature. Further more preferably, the thermal treatment and/or optical treatment are performed at 300 to 500° C. of temperature. Usually, it is possible to obtain an amorphous silicon thin film if the thermal treatment is performed in approximately 550° C. If the thermal treatment is performed in higher temperature than 550° C., a poly-crystal silicon thin film can be obtained. If the temperature does not reach to 300° C., a thermal decomposition of the organic silicon compound does not develop sufficiently; thus, there is a case in which it is not possible to form a silicon thin film having a sufficient thickness. If a poly-crystal silicon thin film is desired, it is possible to convert the above obtained amorphous silicon thin film to a poly-crystal silicon thin film by performing a laser-annealing operation to the above obtained amorphous silicon thin film. For an atmosphere for performing the above annealing operation, an inert gas atmosphere such as a helium, or argon is preferable. Also, an atmosphere in which a reducible gas such as a hydrogen is mixed to these inert gas is preferable.

The thermal treatment and/or the optic treatment can be performed, for example, by using an ordinary hot plate or an electric furnace for heating a substrate 11, or by a lamp annealing method. An light source for the lamp annealing method is not limited to a particular light source. For example, an infrared ray lamp, a xenon lamp, a YAG laser, an argon laser, a carbonic acid gas laser, and an excimer laser such as XeF, XeCl, XeBr, KrF, ArF, ArCl can be used for the light source. These light sources are used when its output is in a range of 10 W to 5000 W. In the present embodiment, it is sufficient if a light source has an output in a range of 100 W to 1000 W. By performing the above processes, the ejected solvent is converted to an amorphous silicon thin film or a poly-crystal silicon thin film.

By doing this, there is not a defect such as a disconnection in the silicon thin film patter which is manufactured in the present embodiment; thus, it is possible to form a superior desirable pattern.

Fourth Embodiment

A liquid crystal device is explained for an example for an electro-optic device as a fourth embodiment of the present invention.

Figure 12:
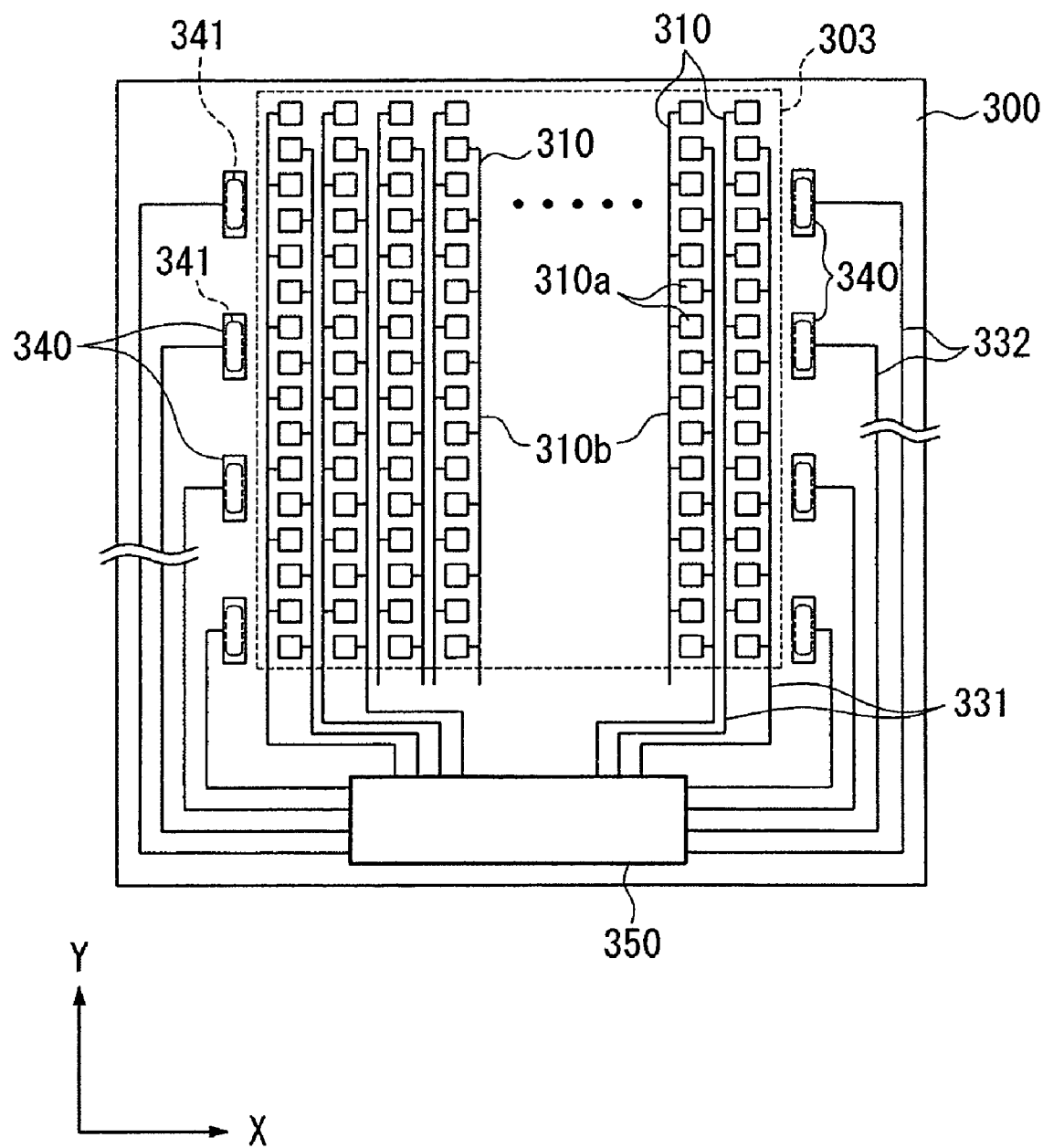
FIG. 12 is a view for showing a part of a liquid crystal device.

FIG. 12 is a plan view for a layout of signal electrodes on a first substrate in a liquid crystal device according to the present embodiment. For a general structure, the liquid crystal device of the present embodiment comprises a first substrate, a second substrate (not shown in the drawing) on which a scanning electrode or the like is disposed, and a liquid crystal (not shown in the drawing) which is sealed between the first substrate and the second substrate.

As shown in FIG. 12, a plurality of signal electrodes 310 . . . are disposed in a multi-matrix manner in a pixel region 303 on the first substrate 300. In particular, each signal electrode 310 . . . is provided with a plurality of pixel electrode sections 310a . . . which are disposed so as to correspond to each pixel and a signal wiring region 310b . . . which connect the pixel electrode sections 310a . . . in a multi-matrix manner so as to expand in a Y-direction.

Reference numeral 350 indicates a liquid crystal driving circuit having one-chip structure. The liquid crystal driving circuit 350 and an end (in a bottom region for a viewer of the drawing) of the signal wiring section 310b are connected via a first wiring 331 . . . . Also, reference numeral 340 indicates a vertical conductive terminal. The vertical conductive terminal 340 and a terminal which is disposed on a second substrate (not shown in the drawing) are connected by a vertical conductive material 341 . . . . Also, the vertical conductive terminal 340 . . . and a liquid crystal driving circuit 350 are connected via a second wiring 332 . . .

In the present embodiment, the signal wiring region 310b . . . , the first wiring 331 . . . , and the second wiring 332 . . . which are disposed on the above first substrate 300 are formed by using a wiring forming device according to the second embodiment by a wiring forming method of the first embodiment respectively.

According to the liquid crystal display device according to the present embodiment, it is possible to form a liquid crystal display device in which a defect such as a disconnection of each wiring and a short circuit hardly occur, and additionally it is possible to realize a small, thin liquid crystal display device.

Figure 13A:
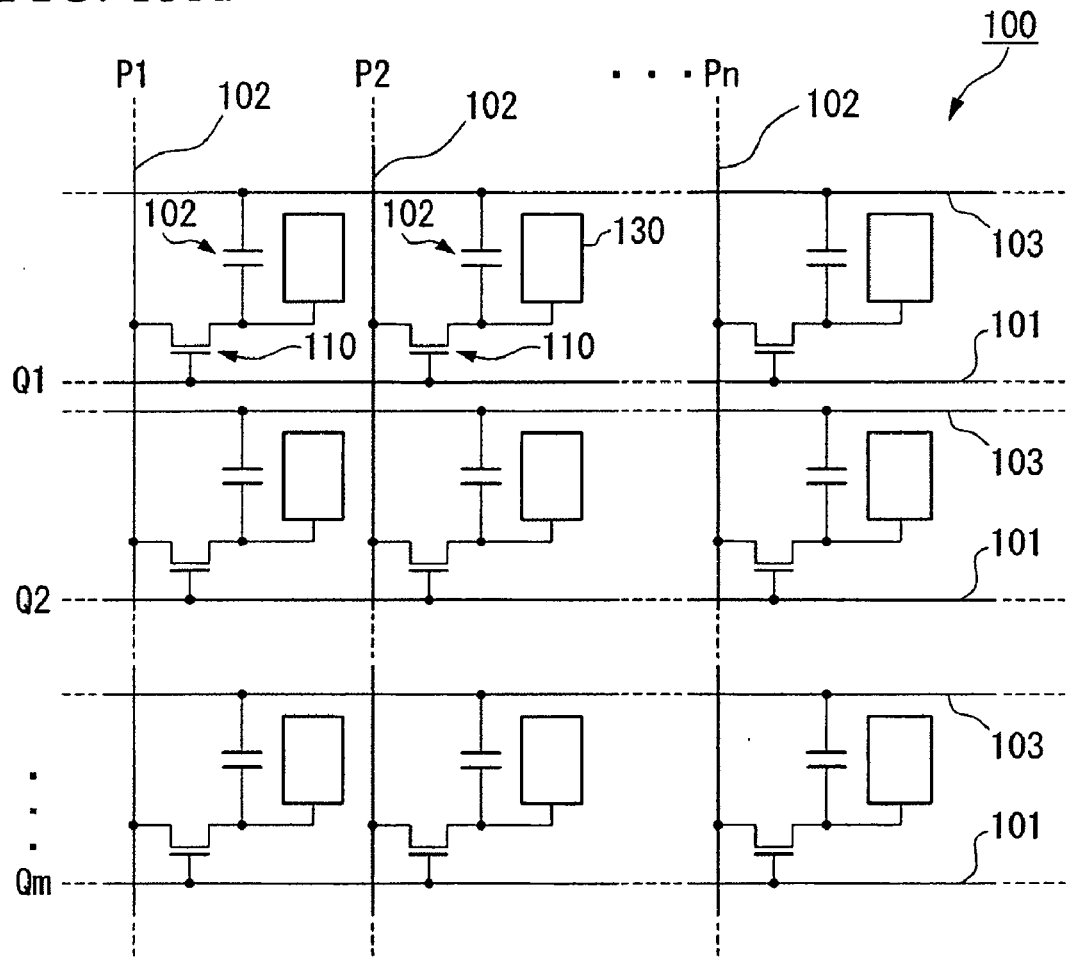
FIGS. 13A and 13B are views for showing another liquid crystal display device.
Figure 13B:
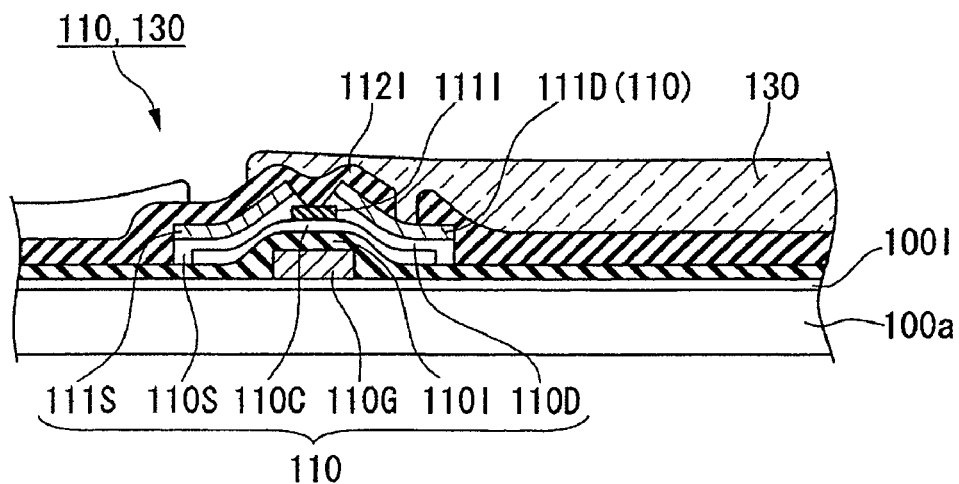

FIGS. 13A and 13B show a liquid crystal display device according to other embodiment. FIG. 13A shows an analogous circuit having various elements and wirings such as a switching element which form an image display area for the liquid display device. FIG. 13B is a cross section of the liquid crystal display device for explaining a structure of a switching element and a pixel electrode which are provided in each pixel.

As shown in FIG. 13A, a scan line 101 which is disposed in a matrix manner, a data line 102, a pixel electrode 130, and a plurality of pixel switching TFTs 110 (hereinafter, called TFT) for controlling the pixel electrode 130 are provided in a liquid crystal display device 100. Scan signals Q1, Q2, . . . , Qm are supplied in the scan line 101 in a pulse manner. Image signals P1, P2, . . . , Pn are supplied in the data line 102. Furthermore, as explained later, the scan line 101 and the data line 102 are connected with the TFT 110 such that the TFT 110 is driven according to the scan signals Q1, Q2, . . . , Qm and image signals P1, P2, . . . , Pn. Furthermore, an accumulating capacity 102 for retaining a predetermined level of image signals P1, P2, . . . , Pn for a predetermined period of time is formed. A capacity line 103 is connected to the accumulating capacity 120.

Next, a structure in the TFT 110 is explained with reference to FIG. 13B.

As shown in FIG. 13B, the TFT 110 is a so called bottom gate (reverse-staggered) TFT. More specifically, the TFT 110 is made by layering an insulating substrate 100a which is a base material for the liquid crystal display device 100, a base protection layer 100I which is formed on the insulating substrate 100a, a gate electrode 110G, a gate insulating layer 110I, a channel area 110C, and an insulating layer 112I for protecting a channel in such an order. A high density N-type amorphous silicon layer source area 110S and a drain area 110D are formed on both sides of the insulating layer 112I. A source electrode 111S and a drain electrode 111D are formed on a surface of the source area 110S and the drain area 110D.

Furthermore, an interlayer insulating layer 112I and a pixel electrode 130 which is made of a transparent electrode such as an ITO (Indium Tin Oxide) are formed on these surfaces. The pixel electrode 130 is electrically connected to the drain electrode 111D via a contact hole on the inter-layer insulating layer 130.

Here, the gate electrode 110G is a part of the scan line 101. Also, the source electrode 111S is a part of the data line 102. Furthermore, the gate electrode 110G and the scan line 101 are formed according to a method for forming a wiring according to the first embodiment by using a device for forming a wiring according to the second embodiment which is explained above.

In such a liquid crystal display device 100, an electricity is supplied to the gate electrode 110G from the scan line 101 based on the scan signals Q1, Q2, . . . , Qm; thus, an electric field is generated near the gate electrode 110I, and the channel area 110C becomes conductive due to the electric field. Furthermore, an electricity is supplied from the data line 102 to the source electrode 111S based on the image signals P1, P2, . . . , Pn. By doing this, the pixel electrode 130 becomes conductive; therefore, an electric voltage is applied between the pixel electrode 130 and facing electrodes. That is, it is possible to drive the liquid crystal display device 100 desirably by controlling the scan signals Q1, Q2, . . . , Qm and the image signals P1, P2, . . . , Pn.

In the liquid crystal display device 100 having such a structure, the gate electrode 10G and the scan line 101 are formed according to a method for forming a wiring according to the first embodiment by using a device for forming a wiring according to the second embodiment which is explained as above. Therefore, it is possible to form a superior reliable wiring pattern in which a defect such as a disconnection does not occur. Therefore, a liquid crystal display device is highly reliable. That is, the same effects which are explained above can be realized.

Here, a method for forming the wiring pattern according to the present embodiment is not limited to cases in which the gate electrode 110G and the scan line 101 are formed. That is, a method for forming the wiring pattern according to the present embodiment can be used for forming other wiring such as a data line 102.

(Field Emission Display)

Next, a field emission display (hereinafter called FED) which is provided with a field emission element is explained for an example for an electro-optic device according to the present invention. Here, the FED is formed according to a method for forming a wiring according to the first embodiment by using a device for forming a wiring according to the second embodiment which is explained above.

Figure 14B:
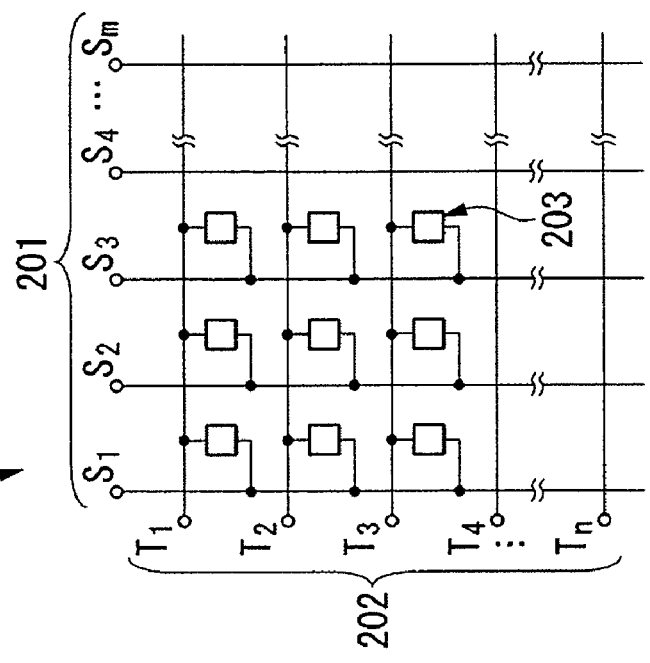
FIGS. 14A to 14C are views for showing an electron discharging device.
Figure 14A:
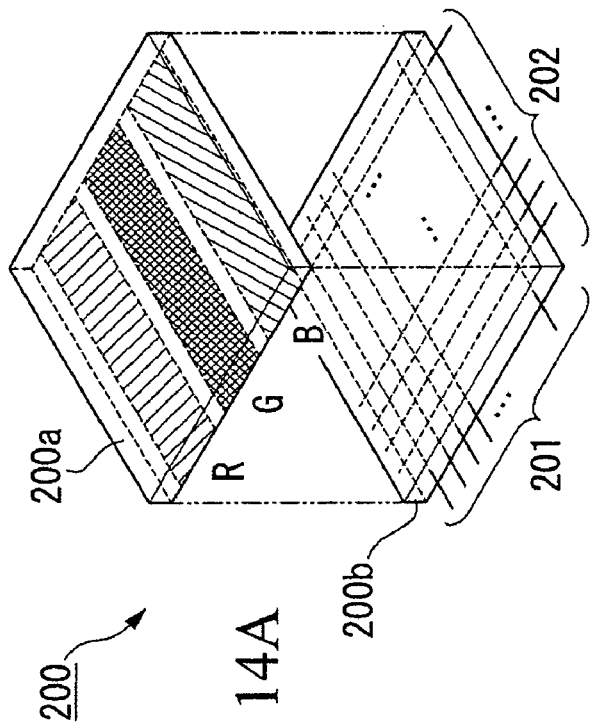
Figure 14C:
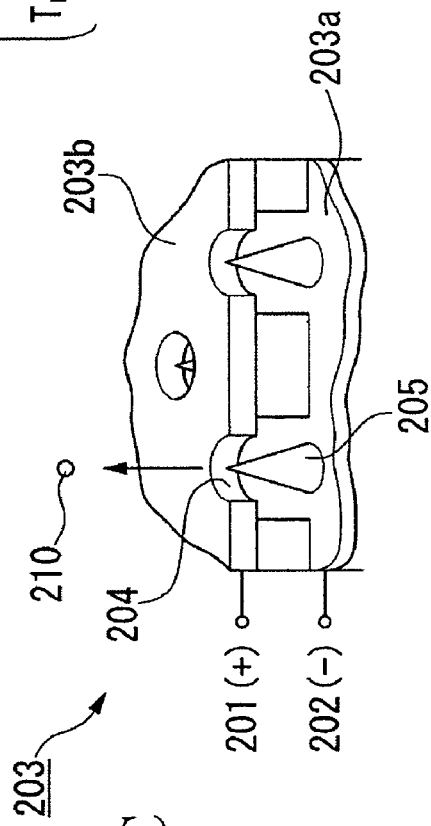

FIGS. 14A to 14C are shown for explaining the FED. FIG. 14A shows a general structure of a disposition of a cathode substrate and an anode substrate which form the FED. FIG. 14B shows a circuit diagram which is provided in the cathode substrate in the FED. FIG. 14C is a perspective view showing an important part of the cathode substrate.

As shown in FIG. 14A, a cathode substrate 200a and an anode substrate 200b are disposed to face each other in an FED 200. As shown in FIG. 14B, the cathode substrate 200a is provided with gate lines 201, emitter lines 202, and field emission elements 203 which are connected to the gate lines 201 and the emitter lines 202. That is, the cathode substrate 200a is a simple matrix driving circuit. The gate signals S1, S2, . . . , Sm are supplied in the gate lines 201. The emitter signals T1, T2, . . . , Tn are supplied in the emitter lines 202. Also, the anode substrate 200b is provided with a fluorescent member which is made of colors such as R (red), G (green), and B (blue). The fluorescent member is fluorescent when it contacts an electron.

As shown in FIG. 14C, the field emission elements 203 are provided with an emitter electrode 203a which is connected to the emitter line 202 and a gate electrode 203b which is connected to the gate line 201. Furthermore, the emitter electrode 203a is provided with a protruding section which is called an emitter tip 205 of which diameter becomes smaller from the emitter electrode 203a toward the gate electrode 203b. A hole section 204 is formed in a corresponding position to the emitter tip 205 on the gate electrode 203b. The tip of the emitter tip 205 is disposed in the hole section 204.

In such an FED 200, an electric voltage is supplied between the emitter electrode 203a and the gate electrode 203b by controlling the gate signals S1, S2, . . . , Sm in the gate line 201, and emitter signals T1, T2, . . . , Tn in the emitter line 202. Thus, an electron 210 moves from the emitter tip 205 to the hole section 204 due to the field emission, and an electron 210 is discharged from a tip of an emitter tip 205. Here, the electron 210 contacts the fluorescent member on the anode substrate 200b; thus, the fluorescent member emits light; therefore, it is possible to drive the FED 200 desirably.

In the FED 200 which has the above structure, the emitter electrode 203a and the emitter line 202 are formed according to a method for forming a wiring according to the first embodiment by using a device for forming a wiring according to the second embodiment as explained above. Therefore, the wiring pattern is superior and reliable in which a defect such as a disconnection does not occur. Therefore, the display device is highly reliable. That is, the same effects as explained above can be realized.

Here, a method for forming the wiring pattern according to the present embodiment is not limited to cases in which the emitter electrode 203a and the emitter line 202 are formed. That is, a method for forming the wiring pattern according to the present embodiment can be used for forming other wiring such as a gate electrode 203b and the gate line 201. Here, in the present invention, although an FED (Field Emission Display) is explained as an example for an electro-optic device, the present invention can be applied to an SED (Surface-Conduction Electron-Emitter Display) and the like.

Here, a manufacturing method of the present invention can be employed in other devices having a wiring pattern. More importantly, for example, a manufacturing method of the present invention can be employed for manufacturing a wiring pattern for an organic electro-luminescent device and a wiring pattern which is formed in an electrophoresis device.

Fifth Embodiment

A plasma display device is explained for an example for an electro-optic device for a fifth embodiment of the present invention.

Figure 15:
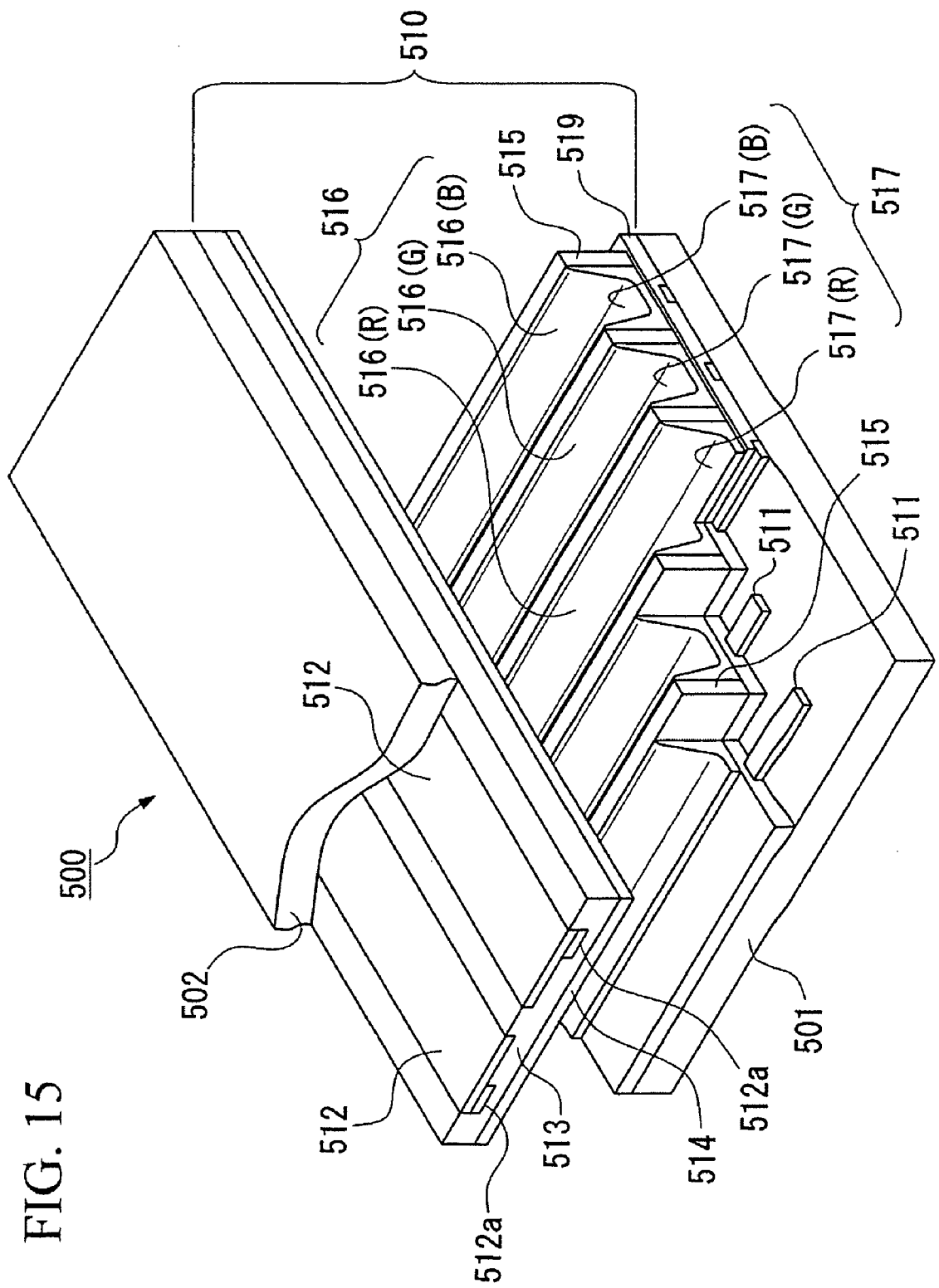
FIG. 15 a disassembled perspective view for a plasma display device.

FIG. 15 is a disassembled perspective view for a plasma display device 500 according to the present embodiment.

For a general structure, the plasma display device 500 comprises glass substrates 501 and 502 which are disposed to face each other, and a discharging display section 510 which is formed between the glass boards 501 and 502.

The discharging display section 510 is provided with a plurality of discharging chamber 516 in a collective manner. In a plurality of the discharging chambers 516, three discharging chambers 516 such as a red discharging chamber 516(R), a green discharging chamber 516(G), and a blue discharging chamber 516 (B) are disposed to form a unit for a pixel. Address electrodes 511 are formed on an upper surface of the (glass) substrate 501 with a predetermined interval in a stripe manner. A dielectric layer 519 is formed so as to cover upper surfaces of the address electrodes 511 and the substrate 501. Furthermore, a partition wall 515 is formed on the dielectric layer 519 along each address electrode 511 between the address electrodes 511 and 511.

Here, although it is not shown in the drawing, the partition wall 515 serves on the dielectric layer 519 in a direction orthogonal to the address electrodes 511 with a predetermined interval in a predetermined position of a longitudinal direction of the partition wall 515. Basically, a rectangular area is formed which is separated by partition walls which neighbor both sides in width direction of the address electrode 511 and partition walls which is disposed to expand in a direction orthogonal to the address electrodes 511. The discharging chamber 516 is formed so as to correspond to these rectangular areas. Three of these rectangular areas form a unit for a pixel. A fluorescent member 517 is disposed inside of the rectangular area which is separated by the partition walls 515. The fluorescent member 517 emits either fluorescent light of red, green, or blue. A red fluorescent member 517(R) is disposed in a bottom of the red discharging chamber 516(R). A green fluorescent member 517(G) is disposed in a bottom of the green discharging chamber 516(G). A blue fluorescent member 517(B) is disposed in a bottom of the blue discharging chamber 516(B).

Next, transparent display electrodes 512 which are made of an ITO (INDIUM TIN OXIDE) are formed near the glass substrate 502 in a stripe manner with a predetermined interval in a direction orthogonal to the above address electrodes 511. Simultaneously, metal bus electrodes 512a are formed near the glass substrate 502 so as to compensate for high resistance in the ITO (INDIUM TIN OXIDE). Also, a dielectric layer 513 is formed so as to cover the transparent display electrodes 512 and the metal bus electrodes 512a. Furthermore, a protecting layer 514 which is made by Mg is formed. Also, the substrate 501 and the glass substrate 502 are attached so as to face each other such that the address electrodes 511 . . . and the transparent display electrodes 512 . . . are disposed orthogonally to each other. The discharging chamber 516 is formed by removing an air from a space which is surrounded by the substrate 501, the partition walls 515, and a protecting layer 514 which is formed near the glass substrate 502 and sealing a noble gas therein. Here, two transparent display electrodes 512 which are formed near the glass substrate are formed so as to be disposed for each discharging chamber 516. The above address electrodes 511 and the transparent display electrodes 512 are connected to an alternating current power supply which is not shown in the drawing; thus, the fluorescent member 517 is excited to emit a light to perform a color display operation in a discharging display section 510 in a necessary position when an electricity is conducted to each electrode.

In the present embodiment, the above address electrodes 511, the transparent display electrodes 512, and the bus electrodes 512a are formed according to a wiring forming method of the first embodiment by using a wiring forming device according to the second embodiment.

According to the present embodiment, it is possible to form a small thin plasma display device in which defects such as disconnections and short circuits in electrodes hardly occurs.
Sixth Embodiment An example for an electronic apparatus as a sixth embodiment of the present invention is explained.

Figure 16A:
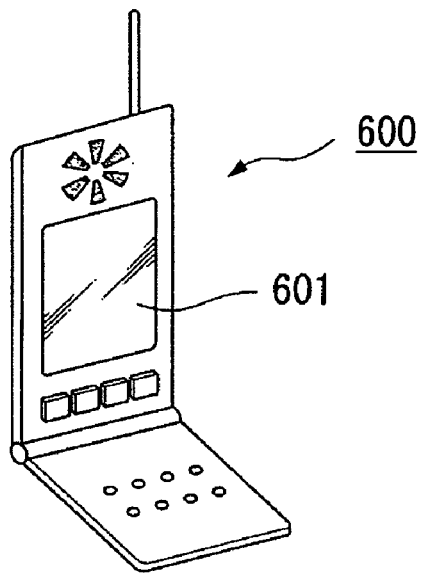
FIGS. 16A to 16C are views for showing examples for an electronic apparatus.

FIG. 16A is a perspective view as an example for a mobile phone. In FIG. 16A, reference numeral 600 indicates a mobile phone unit. Reference numeral 601 indicates a liquid crystal display section which is provided with a liquid crystal device according to the fourth embodiment.

Figure 16B:
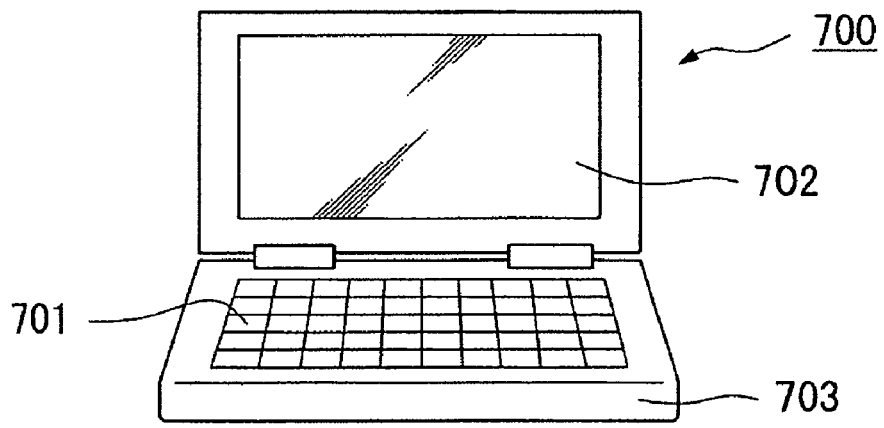

FIG. 16B is a perspective view as an example for a mobile information processing device such as a word processor, and a personal computer. In FIG. 16B, reference numeral 700 indicates an information processing device. Reference numeral 701 indicates an inputting section such as a key board. Reference numeral 703 indicates an information processing unit. Reference numeral 702 indicates a liquid crystal display section which is provided with a liquid crystal device according to the fourth embodiment.

Figure 16C:
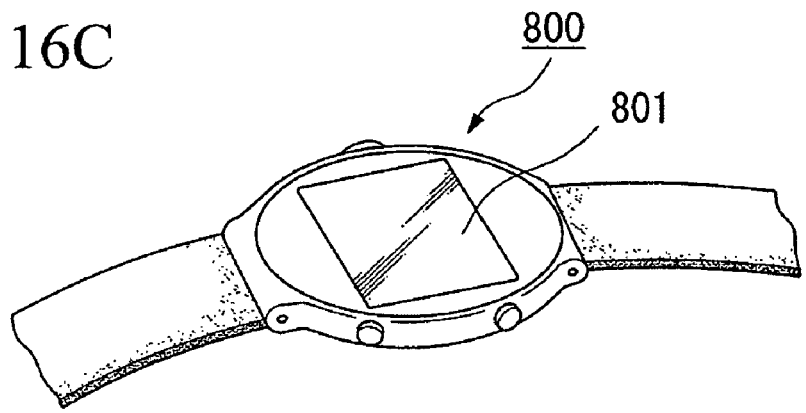

FIG. 16C is a perspective view for an example for a watch electronic apparatus. In FIG. 16C, reference numeral 800 indicates a watch unit. Reference numeral 801 indicates a liquid crystal display device according to the fourth embodiment.

The electronic apparatuses shown in FIGS. 16A to 16C are provided with the liquid crystal devices according to the above embodiment; therefore, it is possible to form liquid crystal display device in which a defect such as a disconnection of each wiring and a short circuit hardly occur, and additionally it is possible to realize a small, thin liquid crystal display device.

Here, although the electronic apparatus in the present embodiment is provided with a liquid crystal device, it is acceptable if the electronic apparatus in the present embodiment is provided with an organic electro-luminescence display device, a plasma display device, or other electro-optic device.

Seventh Embodiment

A non-contact card medium is explained for an example for a seventh embodiment of the present invention.

Figure 17:
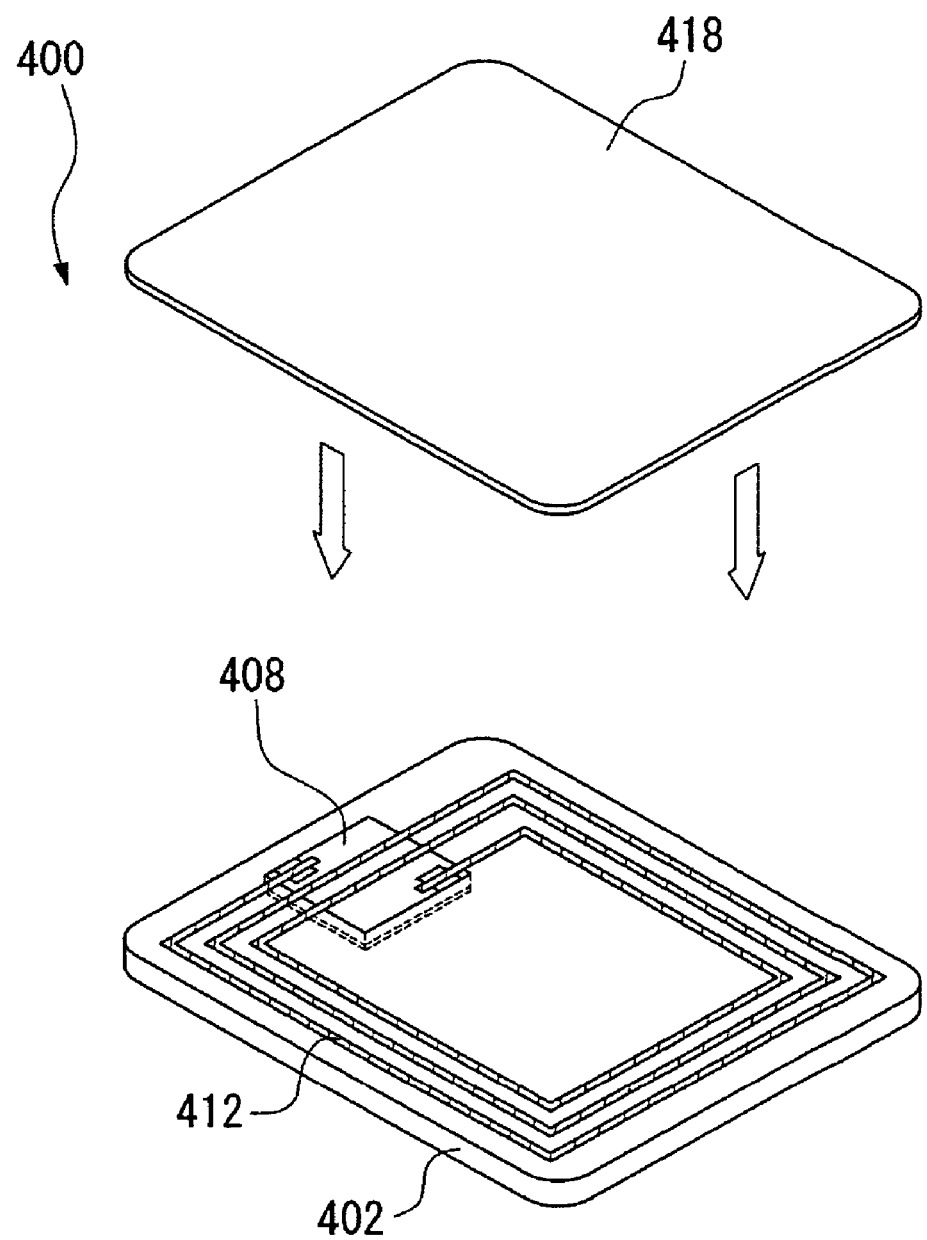
FIG. 17 is a disassembled perspective view for a non-contact card medium.

As shown in FIG. 17, a non-contact card medium 400 contains a semiconductor integrated circuit chip 408 and an antenna circuit 412 in a frame which comprises a card base member 402 and a card cover 418. At least either one of an electric power or a datum is transmitted and received between an external transmitter/receiver which is not shown in the drawing according to at least either method of a magnetic wave method or a electrostatic capacity bonding method.

In the present embodiment, the antenna circuit 412 is formed by the wiring forming method according to the first embodiment by using the wiring forming device according to the second embodiment.

According to the non-contact card medium according to the present embodiment, it is possible to form a non-contact card medium in which defects such as disconnections and short circuits hardly occur in the above antenna circuit 412, and additionally it is possible to realize a small, thin non-contact card medium.

EXAMPLE

After a preparatory treatment is performed to a surface of a glass substrate, a volatizing treatment is performed. Consequently, a lyophilic treatment is performed. In the preparatory treatment, an ultra-violet ray is emitted to the surface of the substrate, and the surface of the substrate is cleaned by a solvent.

In the volatizing treatment, a single moleculer thin film of FAS is formed. More specifically, heptadecafluoro-1,1,2,2tetrahydrodecyltriethoxysilane is used for a compound for forming a self-organizing thin film. This compound and the substrate is contained in a same container such that temperature is maintained at 120 C.° for two hours.

In the lyophilic treatment, an ultra-violet ray having 254 nm of wavelength is emitted for various length of time.

As explained above, volatility of the substrates having different emission time of the ultra-violet ray is examined based on a contact angle to a main solvent such as toluene. The result is shown in TABLE 1.

TABLE 1

| Emission Time (sec.) | Contact Angle (deg.) |
| --- | --- |
| 0 | 80 |
| 15 | 60 |
| 60 | 45 |
| 80 | 30 |
| 90 | 20 |

Next, xylene is added to a dispersion liquid (product name "perfect gold") in which a metal particle is dispersed by dispersing an gold particle having 10 nm diameter in a toluene such that the liquid has condition of 60 mass % of dissolution mass density, 18 cp of viscosity, and 35 N/m of surface tension. The liquid is ejected from an ink jet device which can carry a plurality of ink jet heads by a predetermined pitch while performing a drying operation occasionally; thus, a conductive wiring thin film is formed.

For an ink jet head, a head which is used for a commercially available printer (product name "PM900C") is used. Here, a liquid (ink) sucking section is made of a plastic; therefore, the ink sucking section is modified to a metal parts such that the ink sucking section dissolves to an organic solvent. A relative movement speed between the substrate and the ink jet head is maintained constant, and the pitch is changed only by adjusted an ejecting frequency.

A polymide film which is treated by 4fluorideethylene is attached to a glass substrate so as to form a substrate.

The liquid is ejected from only one nozzle by a head driving waveform and a head driving voltage such that a volume of ejected liquid drop becomes 20 pl. When the liquid drop is ejected under the above condition, a diameter of the ejected liquid drop is approximately 70 μm.

Figure 18:
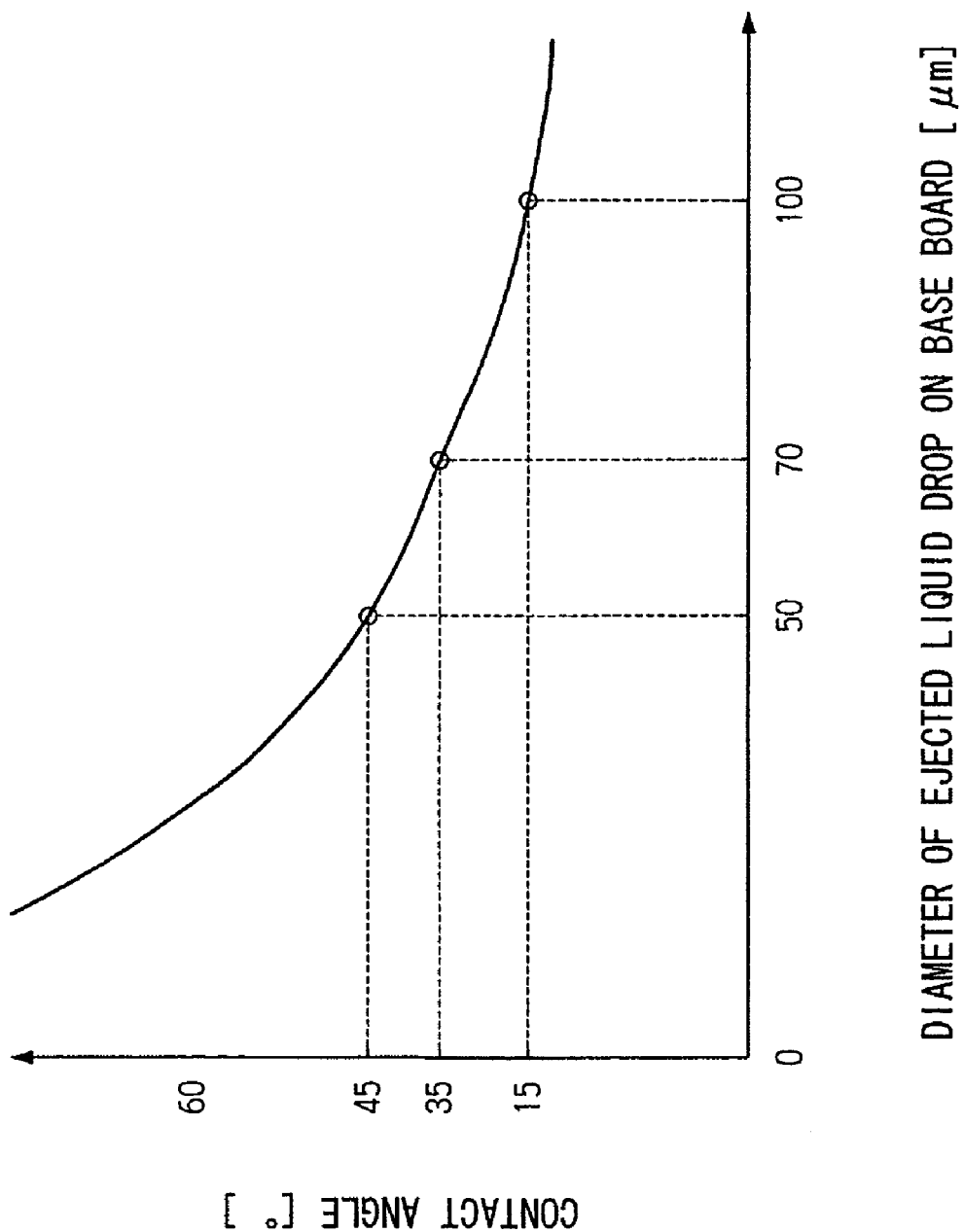
FIG. 18 shows a relationship between a contact angle of ejected liquid drop and a diameter of liquid drop.

FIG. 18 shows a contact angle to a diameter of the ejected liquid drop when the above gold particle dispersion liquid is used.

Figure 19A:
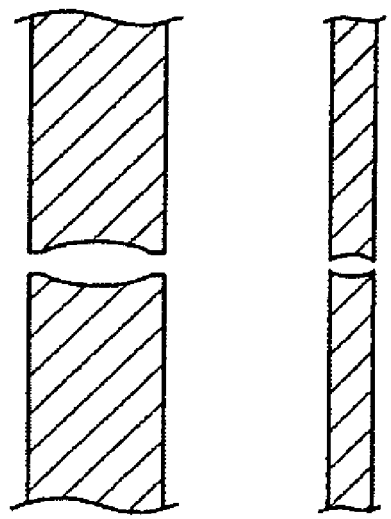
FIGS. 19A and 19B are views for a general structure for a formed conductive thin film wiring.
Figure 19B:
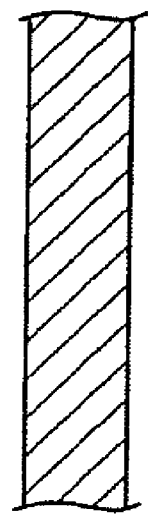

In this case, when the contact angle is more obtuse than 45° or less acute than 15°, a disconnection occurs in a formed gold line as shown in FIG. 19A. In contrast, when the diameter of the liquid drop is maintained in a range of 50 to 100 μm, that is, the contact angle which corresponds to a range of the diameter of the liquid drop is in a range of 15° and 45°, as shown in FIG. 18, a desirable gold line which is not disconnected can be formed as shown in FIG. 19B.

According to such a result, a desirable diameter of the ejected liquid drop on the substrate is 70 μm; therefore, a corresponding contact angle becomes 35°.

Therefore, a desirable contact angle is 35°; thus, emitting time for an ultra-violet ray is 80 seconds with reference to FIG. 1.

A liquid drop is ejected to a substrate in an ejecting process shown in the first embodiment. After that, a drying process is performed by a drying device for five minutes at 100° C. Furthermore, a thermal treatment is performed to the substrate in which a wiring is formed for 30 minutes at 300° C. by using a hot plate; thus, a desirable gold line was obtained.

Japanese patent application Nos. 2002-287453 filed Sep. 30, 2002 and 2003-303512 filed Aug. 27, 2003 are hereby incorporated by reference.

What is claimed is:

1. A method for forming a thin film pattern by ejecting liquid drops which are made from a liquid which contains conductive particles to a predetermined thin film forming area on a substrate, the method comprising:
    a step of forming linear patterns on the substrate including:
    forming a central pattern by ejecting first liquid drops onto the substrate;
    forming a first side section pattern by ejecting second liquid drops onto the substrate, the first side section pattern being next to a first side of the central pattern; and
    forming a second side section pattern by ejecting third liquid drops onto the substrate, the second side section pattern being next to a second side of the central pattern,
    wherein the first side and second side are on opposite sides of the central pattern, and a volume of each second and third liquid drop which is ejected to form each of the first side pattern and the second side pattern is greater than a volume of each first liquid drop which is ejected to form the central pattern, and
    wherein: a first pitch exists between the first liquid drops which are ejected to form the central pattern; a second pitch exists between the second liquid drops which are ejected to form the first side pattern; a third pitch exists between the third liquid drops which are ejected to form the second side pattern; and each of the second and third pitches is narrower than the first pitch.

* * * * *